(12) United States Patent
Akerib et al.

(10) Patent No.: US 8,341,362 B2
(45) Date of Patent: Dec. 25, 2012

(54) SYSTEM, METHOD AND APPARATUS FOR MEMORY WITH EMBEDDED ASSOCIATIVE SECTION FOR COMPUTATIONS

(75) Inventors: Avidan Akerib, Tel Aviv (IL); Eli Ehrman, Bet Shemesh (IL); Moshe Meyassed, Kadima (IL); Oren Agam, Zichron Ya'acov (IL)

(73) Assignee: ZikBit Ltd., Caesaria (IL)

( * ) Notice: Subject to any disclaimer, the term of this patent is extended or adjusted under 35 U.S.C. 154(b) by 242 days.

(21) Appl. No.: 12/650,604

(22) Filed: Dec. 31, 2009

(65) Prior Publication Data
US 2010/0164972 A1    Jul. 1, 2010

Related U.S. Application Data

(63) Continuation-in-part of application No. 12/119,197, filed on May 12, 2008.

(60) Provisional application No. 61/072,931, filed on Apr. 2, 2008.

(51) Int. Cl.
G06F 13/00 (2006.01)
G06F 13/28 (2006.01)
G09G 5/36 (2006.01)

(52) U.S. Cl. . 711/154; 711/108; 711/109; 711/E12.055; 345/560

(58) Field of Classification Search ............ 711/154, 711/108, 109, E12.055; 345/560
See application file for complete search history.

(56) References Cited

U.S. PATENT DOCUMENTS

| | | | |
|---|---|---|---|
| 3,535,694 A * | 10/1970 | Ping et al. | 708/627 |
| 5,177,704 A * | 1/1993 | D'Luna | 365/78 |
| 6,195,738 B1 * | 2/2001 | Akerib | 712/12 |
| 2006/0072846 A1 * | 4/2006 | Song | 382/276 |
| 2009/0003730 A1 * | 1/2009 | Pande et al. | 382/298 |
| 2009/0213110 A1 * | 8/2009 | Kato et al. | 345/418 |
| 2010/0017450 A1 * | 1/2010 | Sun et al. | 708/401 |

* cited by examiner

Primary Examiner — Edward Dudek, Jr.
(74) Attorney, Agent, or Firm — Pearl Cohen Zedek Latzer, LLP

(57) ABSTRACT

A system and method for data processing, the method includes: storing input data words in a row-wise manner in a memory that comprises multiple memory cells arranged in rows and columns; and transposing multiple data words by performing a sequence of shift operations and associative operations; wherein an associative operation comprises comparing in parallel multiple columns of associative memory cells to at least one comparand; and storing transposed data words in the memory.

12 Claims, 23 Drawing Sheets

| 2090 | 2100 | 2210 | 2190 | 2200 | 2310 | 2290 | 2100 | 2410 | 2390 |

2400

SYSTEM, METHOD AND APPARATUS FOR MEMORY WITH EMBEDDED ASSOCIATIVE SECTION FOR COMPUTATIONS

CROSS-REFERENCE TO RELATED APPLICATIONS

This application is a continuation-in-part of U.S. patent application Ser. No. 12/119,197, filed May 12, 2008, which in turn claims priority from U.S. Provisional Patent Application No. 61/072,931, filed Apr. 2, 2008, the entire contents of which are incorporated herein by reference.

FIELD OF THE INVENTION

The present invention relates generally to memory devices, and particularly to incorporation of parallel data processing functions in memory devices.

BACKGROUND OF THE INVENTION

Various methods and systems are known in the art for accessing and processing data that are stored in memory. There is a growing need to process data in an efficient manner.

SUMMARY OF EMBODIMENTS OF THE INVENTION

A method for data processing is provided. According to an embodiment of the invention the method may include: storing input data words in a row-wise manner in a memory that comprises multiple memory cells arranged in rows and columns; and transposing multiple data words by performing a sequence of shift operations and associative operations; wherein an associative operation comprises comparing in parallel multiple columns of associative memory cells to at least one comparand; and storing transposed data words in the memory.

A method for data processing is provided. According to an embodiment of the invention the method may include: storing input data words in a row-wise manner in a memory that comprises multiple memory cells arranged in rows and columns; re-arranging the input data words in response to parallel computational capabilities of an associative memory section; and processing re-arranged input-data words by performing at least one associative operation that comprises comparing in parallel multiple columns of associative memory cells to at least one comparand.

A method for data processing is provided. According to an embodiment of the invention the method may include: storing input data words in a memory that comprises multiple memory cells arranged in rows and columns; applying at least one associative operation on input data words; wherein the applying comprises comparing in parallel multiple columns of associative memory cells to at least one comparand; and utilizing address decoders for internal system transfers and outer system transfers; wherein the system comprises the address decoders, and registers rows that are coupled between the columns of the associative memory cells and the multiple memory cells; wherein internal system transfers involve storing data words in registers coupled to the address decoders.

A method for data processing is provided. According to an embodiment of the invention the method may include: storing input data words in a row-wise manner in a memory that comprises multiple memory cells arranged in rows and columns; and processing multiple row-wise data word sets; wherein the processing comprises generating at least one carry prediction vector, wherein the processing comprises multiple shift operations and associative operations, wherein an associative operation comprises comparing in parallel multiple columns of associative memory cells to at least one comparand.

A system for data processing is provided. According to an embodiment of the invention the system may include: a semiconductor substrate; a memory that is formed on the semiconductor substrate and comprises multiple memory cells arranged in rows and columns; associative memory cells that are arranged in rows and columns; and a control logic that is coupled to the memory and to the associative memory cells; wherein the memory stores input data words in a row-wise manner; wherein the control logic controls a transposition of multiple data words by performing a sequence of shift operations and associative operations that provide transposed data words; wherein an associative operation comprises comparing in parallel multiple columns of associative memory cells to at least one comparand; and wherein the memory stores the transposed data words.

A system for data processing is provided. According to an embodiment of the invention the system may include: a semiconductor substrate; a memory that is formed on the semiconductor substrate and comprises multiple memory cells arranged in rows and columns; associative memory cells that are arranged in rows and columns; and control logic that is coupled to the memory and to the associative memory cells; wherein the control logic controls a re-arrangement of the input data words in response to parallel computational capabilities of an associative memory section, and controls a process of re-arranged input-data words by instructing the associative memory cells to perform at least one associative operation that comprises comparing in parallel multiple columns of associative memory cells to at least one comparand.

A system for data processing is provided. According to an embodiment of the invention the system may include: a semiconductor substrate, a memory that is formed on the semiconductor substrate and comprises multiple memory cells arranged in rows and columns; at least one address decoder; multiple registers coupled to an input output bus that is coupled to additional components; associative memory cells that are arranged in rows and columns, and a control logic that is coupled to the memory and to the associative memory cells; wherein the memory stores input data words; wherein the associative memory cells apply at least one associative operation on input data words; wherein the applying comprises comparing in parallel multiple columns of associative memory cells to at least one comparand; and wherein the system utilizes address decoders for internal system transfers and outer system transfers.

A system for data processing is provided. According to an embodiment of the invention the system may include: a semiconductor substrate; a memory that is formed on the semiconductor substrate and comprises multiple memory cells arranged in rows and columns; associative memory cells that are arranged in rows and columns; and a control logic that is coupled to the memory and to the associative memory cells; wherein the memory stores input data words in a row-wise manner; wherein the associative memory cells process multiple row-wise data word sets; wherein a processing of the multiple row-wise data word sets comprises generating at least one carry prediction vector; wherein the processing comprises multiple shift operations and associative operations; wherein an associative operation comprises comparing in parallel multiple columns of associative memory cells to at least one comparand.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanied drawings in which:

FIG. 10-20 illustrates data arrangements according to various embodiments of the invention;

Figure 1:
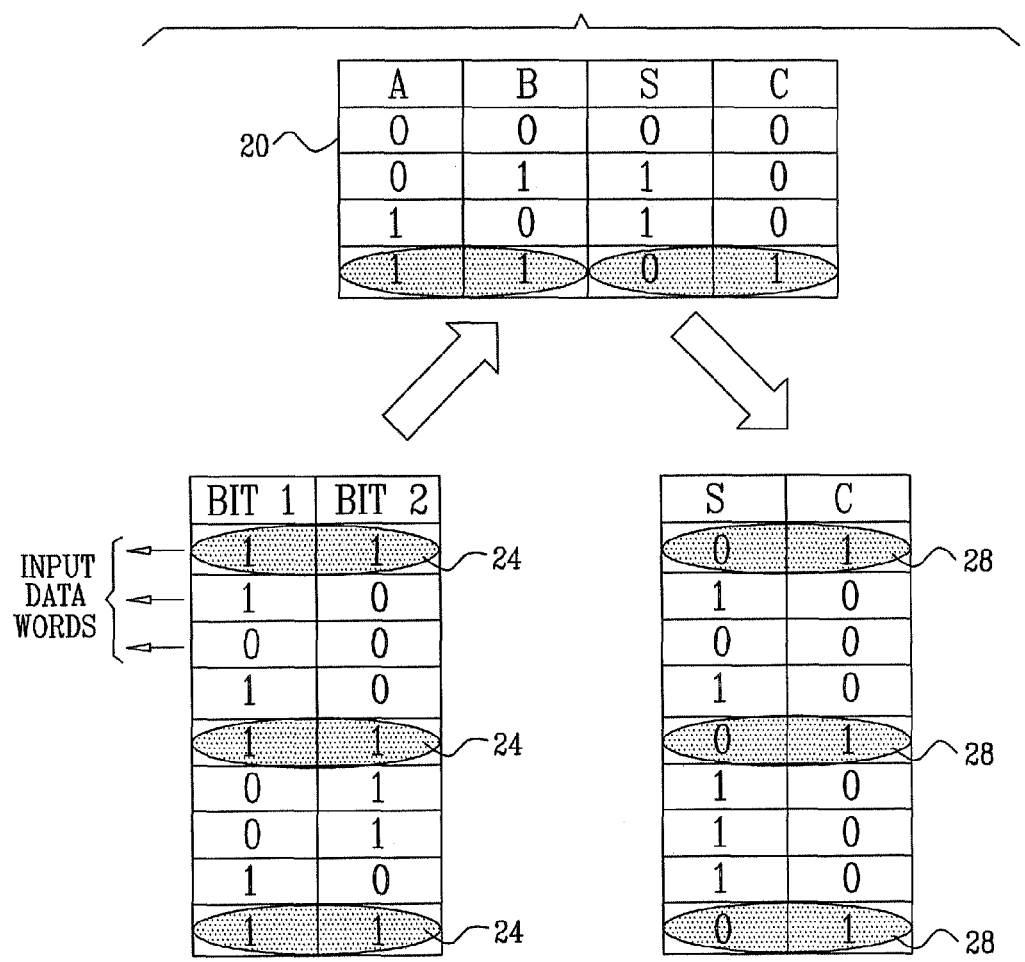
FIG. 1 is schematic illustration demonstrating the concept of parallel processing using a truth table 20, in accordance with an embodiment of the present invention.

It will be appreciated that for simplicity and clarity of illustration, elements shown in the drawings have not necessarily been drawn accurately or to scale. For example, the dimensions of some of the elements may be exaggerated relative to other elements for clarity or several physical components may be included in one functional block or element. Further, where considered appropriate, reference numerals may be repeated among the drawings to indicate corresponding or analogous elements. Moreover, some of the blocks depicted in the drawings may be combined into a single function.

DETAILED DESCRIPTION OF EMBODIMENTS OF THE INVENTION

In the following detailed description, numerous specific details are set forth in order to provide a thorough understanding of the invention. However, it will be understood by those of ordinary skill in the art that the present invention may be practiced without these specific details and that generalization for different programming languages, hardware architectures, operating systems, and resources is possible. In other instances, well-known methods, procedures, components, and circuits may not have been described in detail so as not to obscure the present invention.

Parallel Processing Using Truth Tables

Before describing the disclosed methods and systems in detail, some background explanation regarding the concept of performing bit-wise operations using parallel truth tables will be provided.

FIG. 1 is schematic illustration demonstrating the concept of parallel processing using a truth table 20, in accordance with an embodiment of the present invention. In the present example, the data processing operation comprises summations of pairs of bits along each data word. The present example demonstrates a technique for performing the bit-wise summation in parallel, over a large plurality of data words. The bit-wise summation operation is defined by truth table 20. According to truth table 20, input bits A and B of a given data word are summed to produce a sum bit S and a carry bit C. The bitwise summation operation produces two result vectors that store the sum and carry values of the corresponding bit pairs.

The bit-wise summation is applied in parallel to two bits (denoted "BIT 1" and "BIT 2") in a large plurality of data words. The operation can be carried out in parallel by (1) identifying all bit pairs having a given set of bit values, (2) looking up truth table 20 to determine the values of the sum and carry bits that correspond to this set of bit values, and (3) setting the sum and carry values in the result vectors to the values retrieved from the truth table. This process is repeated over all possible bit values.

For example, the figure shows bit pairs 24 in the input data words that are equal to (1,1). According to truth table 20, the corresponding sum value for these bit pairs is 0 and the corresponding carry value is 1. Thus, the sum and carry values of the result vectors are set to 0 and 1, respectively. The figure shows bit pairs 28 in the result vectors that correspond to bit pairs 24 in the input data words.

Similarly, for every (0,0) bit pair in the input data words, the corresponding (sum, carry) values in the 14 result vectors are set to (0,0). For every (0,1) bit pair in the input data words, the corresponding (sum, carry) values are set to (1,0). For every (1,0) bit pair in the input data words, the (sum, carry) values are set to (1,0), as defined by truth table 20.

Note that the input may comprise thousands or even millions of input data words. Nevertheless, the bit-wise operation is carried out using only four parallel truth table look-up operations, regardless of the number of input data words. The concept of performing bit-wise operations using parallel truth tables can be used to perform any other bit-wise operation.

In the example of FIG. 1, the truth table had a two-bit input and a two-bit output. In alternative embodiments, however, truth tables can have any suitable number of input bits and any suitable number of output bits. For example, a truth table can define an operation between two multi-bit vectors (each represented by two or more bits), to produce a multiple-bit result vector.

A parallel bit-wise operation can thus be generalized and defined as a mapping operation that maps a certain pattern of input bit values to a certain pattern of output bit values. Alternatively to using truth tables, mapping the input bit patterns to the desired output bit patterns may be carried out using any other suitable function, circuitry or data structure. Generally, a truth table may comprise M input bits, N output bits and K entries. (The number of entries K may sometimes be smaller than $2^M$, since some bit value combinations of the input bits may be invalid or restricted.) In many cases, a large and complex truth table can be broken down into an equivalent set of smaller and simpler truth tables.

Thus, any suitable data processing operation (any Turing machine, as is known in the art) that operates on a set of input data vectors can be represented as a set of bit-wise operations, which in turn can be carried out by looking-up one or more parallel truth tables.

Bit-Wise Operations Using Data Transposition

In the description of FIG. 1 above, bits of a given order are associated with columns, and the bit-wise operation is applied to vertical columns in parallel. In most conventional memory devices and computing devices, however, data is stored and read and operations are performed in a row-wise manner. In order to perform bitwise operations efficiently using conventional memory arrays, the methods and systems described herein transpose the input data words, so as to arrange them in a column-wise orientation in the memory.

Figure 2:
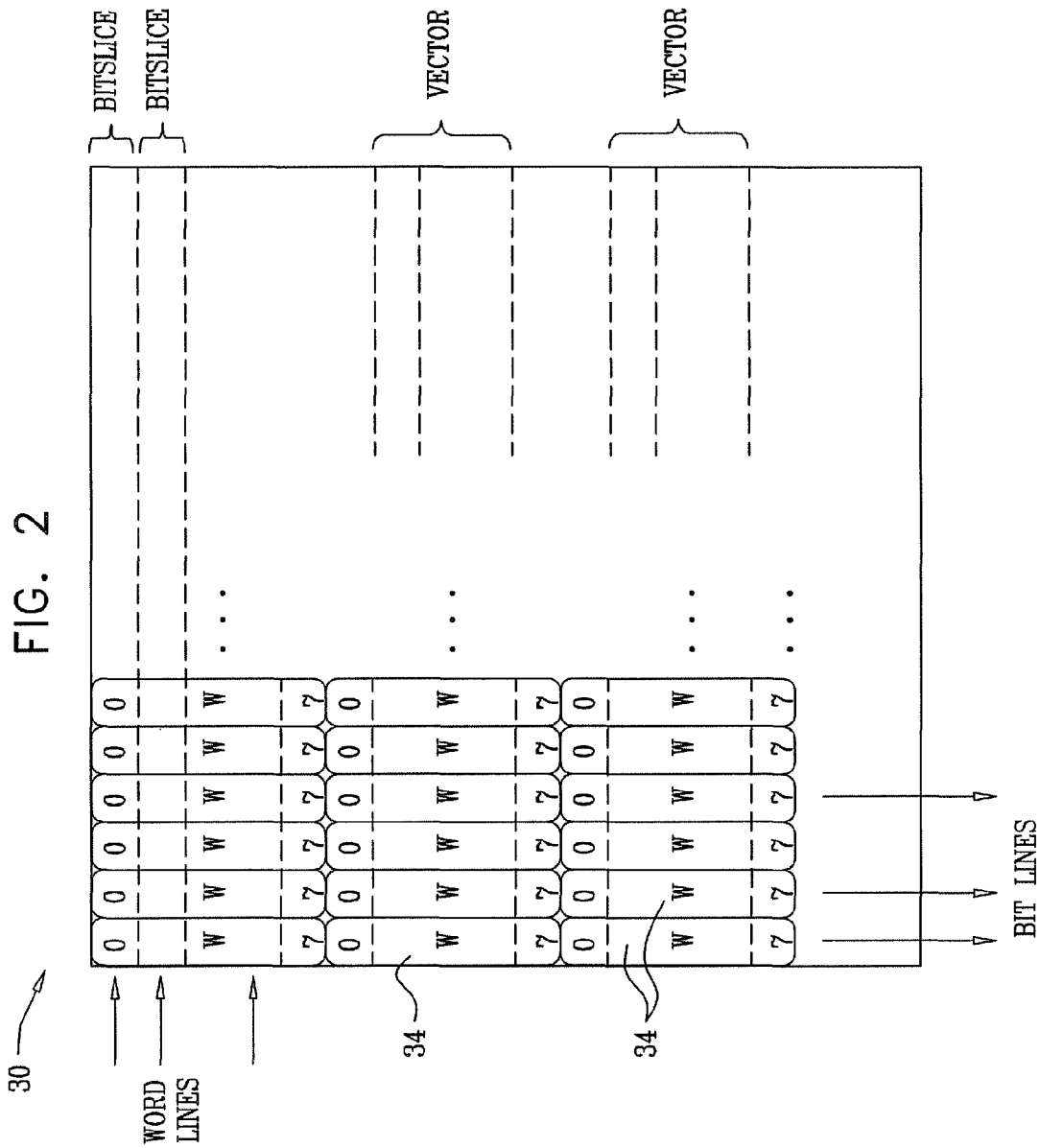
FIG. 2 is a schematic illustration of a memory array 30 storing data in a column-wise orientation, in accordance with an embodiment of the present invention.

FIG. 2 is a schematic illustration of a memory array 30 storing data in a column-wise orientation, in accordance with an embodiment of the present invention.

Array 30 comprises multiple memory cells that store respective data bits. The terms "memory cells" and "bits" are used herein interchangeably for the sake of clarity. Nevertheless, the methods and systems described herein can be generalized to operate with multi-level memory technologies, in which each memory cell stores more than one bit. In these embodiments, truth table entries may take non-Boolean values (e.g., {0 . . . 3} or (0 . . . 7)).

Array 30 is arranged in rows and columns. The rows are commonly referred to as word lines, and the columns 30 are commonly referred to as bit lines. In a typical memory array, data is written to the memory in a row-wise manner, so that data words are laid along the rows of the array. Similarly, conventional read operations read data from the memory in a row-wise manner, i.e., read the data from a given word line.

In order to perform bit-wise operations on multiple data words in parallel using row-wise read and write commands, the methods and systems described herein transpose the input data words. In the context of the present patent application and in the claims, the term "transposing" refers to any operation that converts data words from a row-wise orientation to a column-wise orientation, so that the bits of a given data word are stored in more than a single row of the memory. In some transposition operations, each transposed data word lies in a single column of the array. Transposition is not limited, however, to placing each transposed data word in a single column. For example, an eight-bit data word may be transposed to four two-bit rows.

FIG. 2 shows input data words 34 after an exemplary transposition operation. As can be seen in the figure, data words 34 are arranged in a column-wise orientation in array 30. In the present example, each word comprises eight bits, although any other suitable word length can be used. In the column-wise orientation, each row of the array stores bits of a given order that belong to different words. A row storing bits of a given order is referred to herein as a bitslice. A vector is defined herein as a set of multiple bitslices. The bitslices that form a given vector may be located in consecutive or non-consecutive rows in the array. Each column of a given vector is referred to as an element of the vector.

In the column-wise orientation, bit-wise operations on data words can be carried out in parallel by performing parallel bit-wise operations on rows of the array. Referring to FIG. 2, for example, a bit-wise logical OR between the first and eighth rows of array 30 actually computes in parallel a bit-wise logical OR between the LSBs and MSBs of all the words stored in the first eight rows of the array. The result can be stored in another row of the array for further processing.

An Example of a Hardware Configuration

Figure 3:
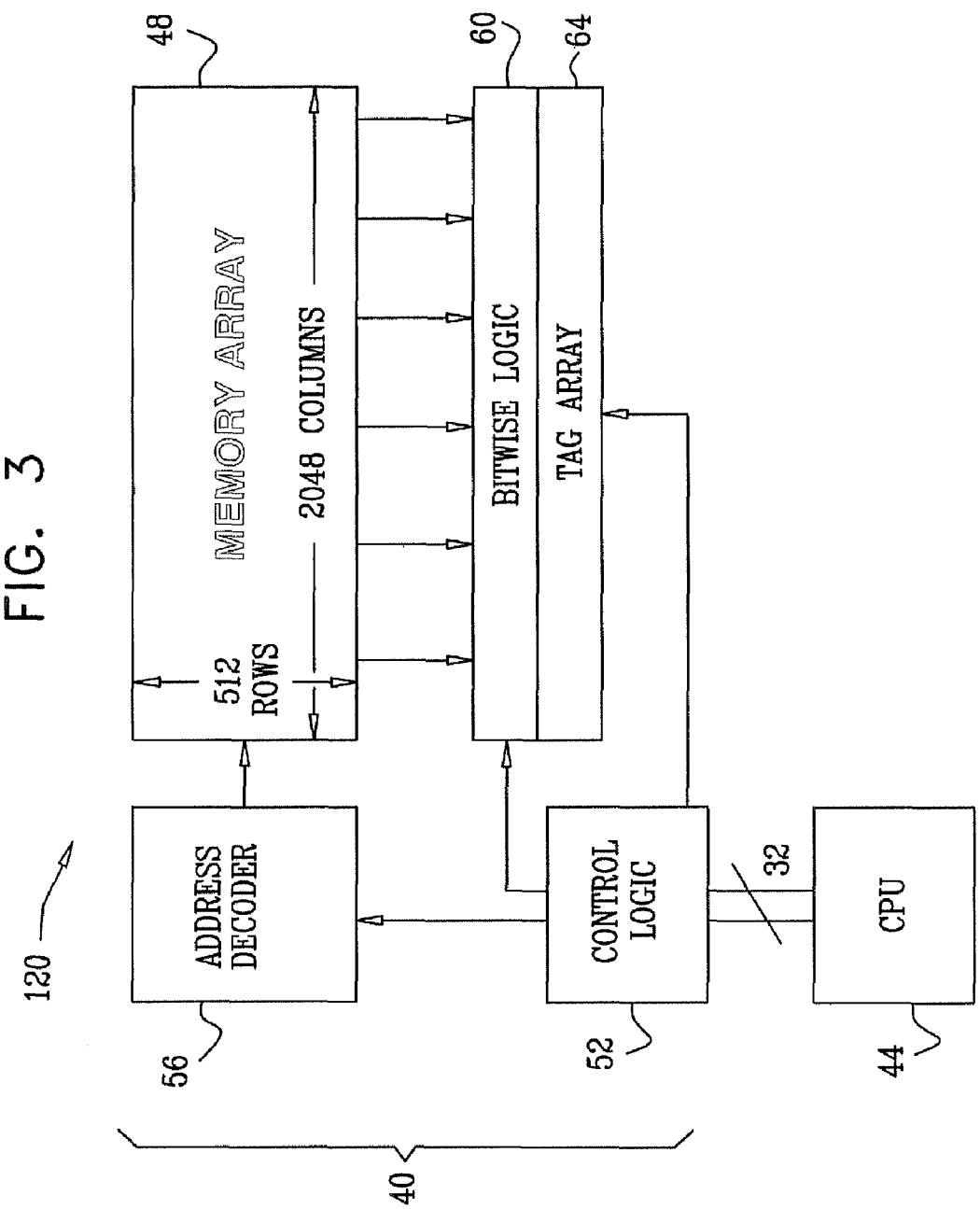
FIG. 3 is a block diagram that schematically illustrates a system 40 for data storage and processing, in accordance with an embodiment of the present invention.

FIG. 3 is a block diagram that schematically illustrates a system 40 for data storage and processing, in accordance with an embodiment of the present invention. System 40 stores data and performs parallel data processing operations on behalf of a Central Processing Unit (CPU) 44. System 40 comprises a memory array 48, which is similar to array 30 of FIG. 2 above. In the present example, array 48 comprises 2048 columns (bit lines) and 512 rows (word lines), although any other suitable dimensions can be used. The memory array may comprise any suitable memory technology, such as Static Random Access Memory (SRAM), Dynamic RAM (DRAM) or Flash memory. In some embodiments, memory array 48 and address decoder 56 may comprise known, conventional hardware units.

The configuration of FIG. 3 enables system 40 to operate with conventional CPUs using conventional bus interfaces, and still provide the enhanced processing functionality described herein. In some embodiments, system 40 supports dual-mode operation. In this type of operation, the system supports both conventional (serial) memory access operations and parallel operations. Dual mode operation and several alternative hardware configurations are described and discussed further below.

CPU 44 or other data word provider (such as a sensor of a camera) provides data words for storage and processing to Control logic 52, in the present example over a 32-bit bus interface. The control logic accepts the data words from the CPU and carries out the parallel data processing methods described herein. In particular, the control logic transposes the data words to column wise orientation, manages the performing of bit-wise operations between rows of the array, transposes the data back to row-wise orientation and returns the results to the CPU. System 40 further comprises an address decoder 56, which decodes word line addresses for storage and retrieval of data in and out of array 48.

The bit-wise operations between rows of array 48 are performed by bit-wise logic 60. Bitwise logic 60 and tag array 64 can form a computational section of the system. In some embodiments, bitwise logic 60 applies a truth table look-up function per each column (bit line) of array 48. Alternatively, however, logic 60 may apply any suitable bit-wise logic function to a given set of bits along the respective bit line. The bit-wise logic can be viewed as a set of multiple bit processors, one bit processor associated with each column of the memory. Each bit processor may perform truth table lookup or any other bit-wise operation on a given set of bits along the respective bit line. In some implementations, the bit processors may comprise Arithmetic Logic Units (ALUs) that perform various arithmetic operations.

In some embodiments, the system comprises a tag array 64. The tag array comprises a tag flag (bit) per each column, which is used for storing interim results and for marking specific columns during operation, as will be explained below.

The system configuration of FIG. 3 is an exemplary configuration, which is chosen purely for the sake of conceptual clarity. Any other suitable configuration can be used for implementing the methods and systems described herein. The address decoder, control logic, bit-wise logic and tag array are regarded as a control circuit, which is connected to the memory array and carries out the methods described herein.

In some embodiments, the control logic, bit-wise logic and tag array are fabricated on the same semiconductor die as the memory array. Alternatively, the different components of system 40 may be fabricated on two or more dies and packaged in a single package, such as in a System on Chip (SoC) or Multi-Chip Package (MCP).

Any of the control logic or the controller may be split into two or more components. For example, the CPU may be off-chip and communicate with the control logic directly. As another example, the system may comprise a sequencer that receives a single instruction and in response sends multiple instructions to the control logic.

Thus, in some embodiments, system 40 is regarded as a "computational memory" unit, which carries out both storage functions and parallel data processing functions on the stored data. The computational memory unit may operate under the control of conventional CPUs using conventional bus interfaces.

Another Example of a Hardware Configuration

Figure 7:
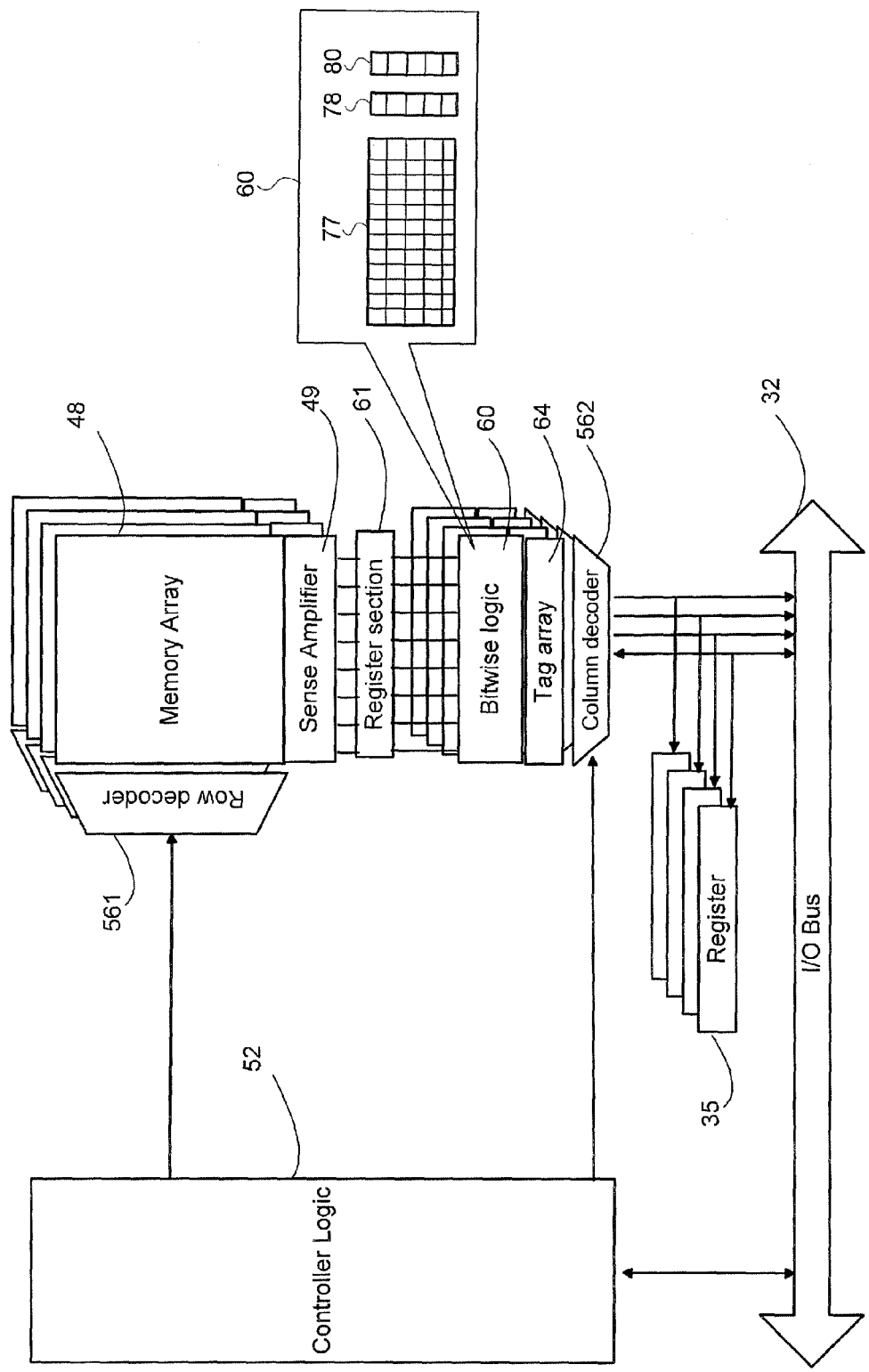
FIG. 7 is a block diagram that schematically illustrates a system for data storage and processing, in accordance with an embodiment of the present invention.

FIG. 7 is a block diagram that schematically illustrates a system 41 for data storage and processing, in accordance with an embodiment of the present invention.

System 41 stores data and performs parallel data processing operations on behalf of a Central Processing Unit (CPU) (not shown). The CPU is connected to system 41 via one or more buses such as bus 32. Bus 33 can also be connected to other components (not shown). System 41 can exchange data words with the CPU or other components that are connected to bus 33 by performing external system data transfers. Various components of system 41 can exchange information by performing inter system data transfers.

System 41 includes memory array 48. Memory array 48 can be connected to sense amplifiers 49. The sense amplifiers 49 can be connected to a register section 61. Register section 61 is connected in parallel to an associative memory section that includes tag array 64 and bitwise logic 60. Bitwise logic 60 can include a two dimensional array of associative memory cells (collectively denoted 77) as well as one or more comparand registers such as comparand register 78 and one or more mask registers such as mask register 80.

The width of an associative memory section cell row can equal the number of memory cells per each column. Alternatively, the width of the associative memory section cell row may differ from the number of memory cells per each column.

Data words can be transferred either in a predefined manner or in a random access manner between register rows, associative memory section cell rows and buffer rows. The rows of these different sections are coupled to each other to form an array of rows. The predefined manner of transferring input units includes transferring data words from one row to another row (such as but not limited to an adjacent row. The random access manner allows a transfer of data words from a source row to a destination row without passing the data words through all the rows that are positioned between the source and destination rows. This random access transfer utilizes registers 35 that are connected to bus 32 and to memory 48. The transfer of a row can be assisted by utilizing address decoders such as column decoders 562, and additionally or alternatively row decoders that control access to the memory.

System 41 may facilitate at least one of the following: (i) a data transfer of an entire row (from any row to another), (ii) random access data transfer of a portion (even a small portion) of a row to any other portion of another row).

Expressing Data Processing Operations by a Sequence of Parallel Compare and Write Operations As noted above, parallel data processing operations on multiple data words can be represented as sequences of bit-wise operations on rows of memory array 48, assuming the stored data words have been transposed to column-wise orientation. In particular, any data processing operation can be represented as a sequence of two types of parallel bit-wise operations on rows of array 48, denoted WRITE and COMPARE.

The WRITE operation stores a given bit pattern into some or all elements of a given vector (i.e., into some or all of the columns of a single bitslice of the vector). The COMPARE operation compares the elements of a vector to a given bit pattern, and marks the vector elements that match the pattern. The COMPARE result may be used as a flag that determines to which column a pattern is stored.

Consider, for example, a 3-bit vector consisting of rows 10-12 of the array (after transposition), and assume that the WRITE operation is to write the bit pattern "101" (decimal 5) into each element of this vector.

In other words, the WRITE operation is to set row 10 of the array to all "1"s, row 11 to all "0"s and row 12 to all "1"s. This operation is easily carried out using conventional memory access operations.

In the example of FIG. 3, control logic 52 sets address decoder 56 to address row 10, and stores all "1"s data in this row. The control logic then increments the address value (The examples in this section assume 32-bit memory access. System configurations that exploit the higher number of columns of the memory array to achieve a higher degree of parallelism are addressed further below.)

In some embodiments, however, the WRITE operation is requested to write the bit pattern to only some of the vector elements. All other elements of the vector are to retain their previous values. This variant of the WRITE operation writes the bit pattern to the vector elements whose respective tag flags (i.e., the respective bits in tag array 64) are set to "1".

The vector elements whose tag flags are "0" retain their previous values. The selective WRITE operation may be implemented by reading each row of the vector, selectively modifying the read row based on the tag flags, and re-writing the row into the memory. Alternately, a selective WRITE operation can be implemented by activating the WRITE on only some of the bitlines of the memory array. Consider, for example, an operation that writes the bit pattern "101" 22 into only the first and fifth elements of a vector consisting of rows 10-12 of the array. It is noted that the entire pattern can be written at once to all rows of the vector.

Parallel Data Processing Method Description

Figure 4:
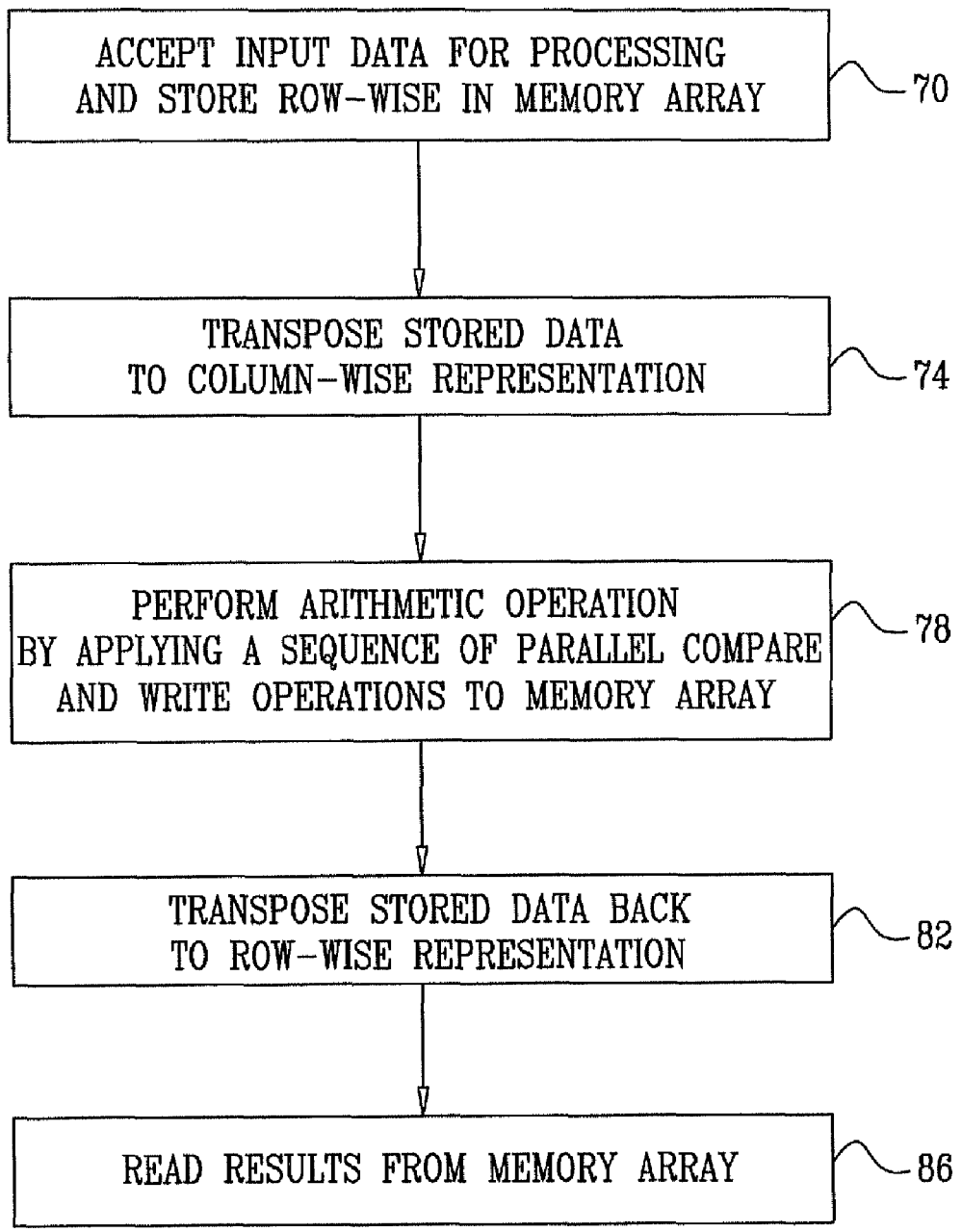
FIG. 4 is a flow chart that schematically illustrates a method for parallel data processing, in accordance with an embodiment of the present invention.

FIG. 4 is a flow chart that schematically illustrates a method for parallel data processing, in accordance with an embodiment of the present invention.

The description that follows assumes that the method is carried out by control logic 52 of FIG. 3, in conjunction with bit-wise logic 60, tag array 64 and address decoder 56. Alternatively, however, the method can be carried out by any other suitable logic or processor (e.g., in CPU 44). The method can be implemented in hardware, in software, or as a combination of hardware and software elements.

The method begins with control logic 52 accepting input data comprising data words, at an input step 70.

The control logic stores the input data in array 48 in a row-wise orientation, such that the data words are laid along rows of the memory array. The control logic transposes the stored data words, at a transposing step 74. After transposing the data, the input data words are laid along columns of array 48, such that each row stores corresponding bits of a given order from different data words. An example of data words arranged in column-wise orientation is shown in FIG. 2 above.

Figure 5:
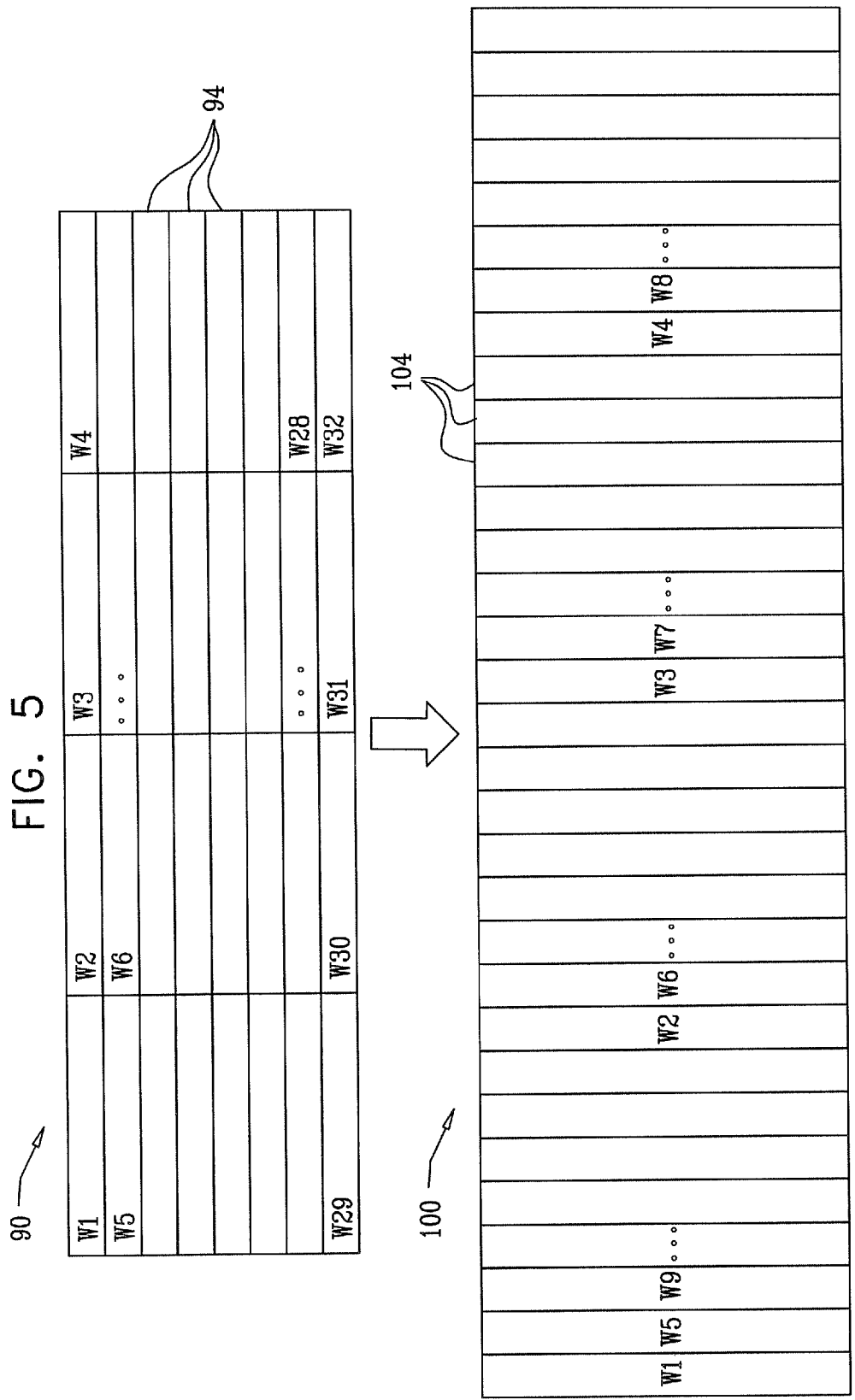
FIG. 5 shows a source set of input data words, which is transposed to produce a destination set of transposed data words according to an embodiment of the invention.

The control logic may use any suitable method for transposing the data. An exemplary method is shown in FIGS. 5 and 6 below. After transposing the data, the control logic carries out a parallel data processing operation, at an operation step 78. The data processing operation may comprise a logical operation, an arithmetic operation, a conditional execution operation, a control flow operation, or any other operation that can be expressed as a sequence of bit-wise operations that are applied to the input data words. In some embodiments, the control logic performs the data processing operation by applying a sequence of parallel COMPARE and WRITE operations, as explained above. The result of the data processing 10 operation is written in one or more rows of the memory array.

After performing the data processing operation, control logic 52 transposes the stored data back to a row-wise orientation, at a re-transposing step 82. Typically although not necessarily, the re-transposing operation is the same as the transposing operation carried out at step 74. The control logic then reads the results of the parallel data processing operation from array 48 and outputs the result to CPU 44, at an output step 86.

Data Transposition

Figure 6:
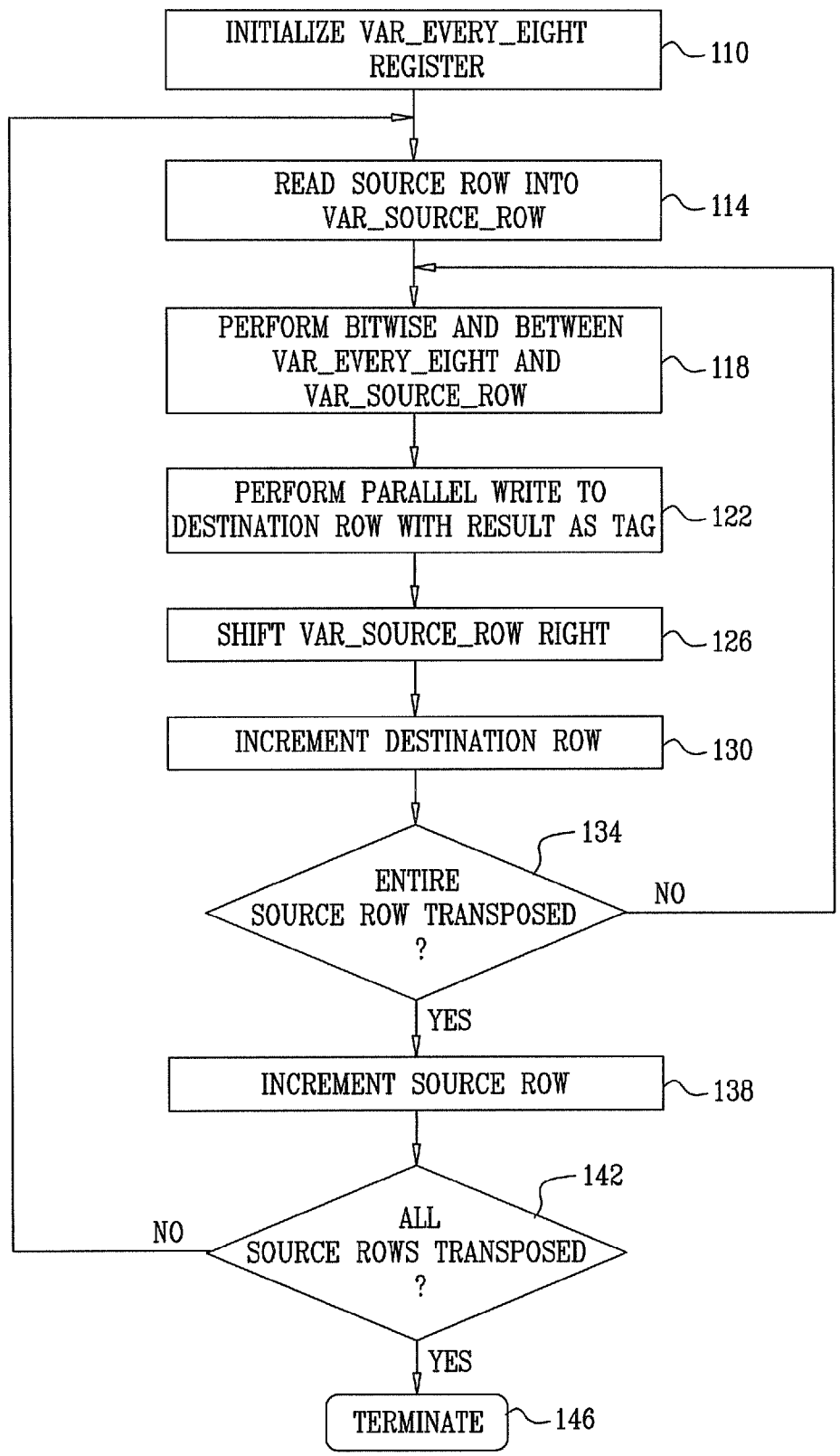
FIG. 6 is a flow chart that schematically illustrates a method, which is carried out by a control logic for transposing data from row-wise to column wise orientation, in accordance with an embodiment of the present invention.

FIGS. 5 and 6 below describe a method for transposing data, in accordance with an embodiment of the present invention. The method of FIGS. 5 and 6 can be used in steps 74 and 82 of FIG. 4 above.

FIG. 5 shows a source set 90 of input data words 94, which is transposed to produce a destination set 100 of transposed data words 104 according to an embodiment of the invention. In the present example, the input data words comprise thirty-two eight-bit data words denoted W1 . . . W32, which are laid out in a row-wise orientation. The input data words are transposed to form the output data words using the method of FIG. 6 below. The output data words are laid in a column-wise orientation, typically in a different location in the memory array.

As can be seen in the figure, the transposition process modifies the order of the output data words. However, when the method of FIG. 6 is used again to re-transpose the data words back to row-wise orientation, the order of the re-transposed data words is maintained.

FIG. 6 is a flow chart that schematically illustrates a method, which is carried out by control logic 52 for transposing data from row-wise to column wise orientation, in accordance with an embodiment of the present invention. Alternatively, the method can be carried out by CPU 44 or other processor. The method transposes the four input words in the first row of source set 90 to four output words in columns 1, 9, 17 and 25 of destination set 100 in parallel. Then, the four input words in the second row of the source set are transposed in parallel to produce four output words in columns 2, 10, 18 and 26 of the destination set. The process is repeated until all rows of the source set have been transposed.

The method of FIG. 6 begins with logic 52 initializing a 32-bit register denoted VAR_EVERY_EIGHT, at an initialization step 110. Every eighth bit of register VAR_EVERY_EIGHT (i.e., bits 1, 9, 17 and 25) are set to "1", and the other bits are set to "0".

The control logic reads a row of the source set into a register denoted VAR_SOURCE_ROW, at a row reading step 114. The logic calculates a bit-wise AND between VAR_EVERY_EIGHT and VAR_SOURCE_ROW, at a row calculation step 118. The control logic uses the result of step 114 as the tag array, and performs a parallel WRITE operation to the corresponding row of the destination set, at a row writing step 122. The control logic then shifts 28 VAR_SOURCE_ROW one position to the right, at a row shifting step 126. The control logic increments the destination row, at a destination row incrementing step 130.

The process is repeated eight times, until the entire source row has been transposed. The control logic checks whether the entire source row has been transposed, at an entire row checking step 134. If not, the method loops back to step 118 above. If the entire source row has been transposed, the control logic increments the source row, at a source row incrementing step 138.

The control logic checks whether all source rows have been transposed, at an all rows checking step 142. If all source rows have been transposed, the method terminates at a termination step 146. Otherwise, the method loops back to step 114 above, and the control logic reads and transposes the next source row. For each source row, the destination column is higher by one with respect to the previous source row.

Figure 8:
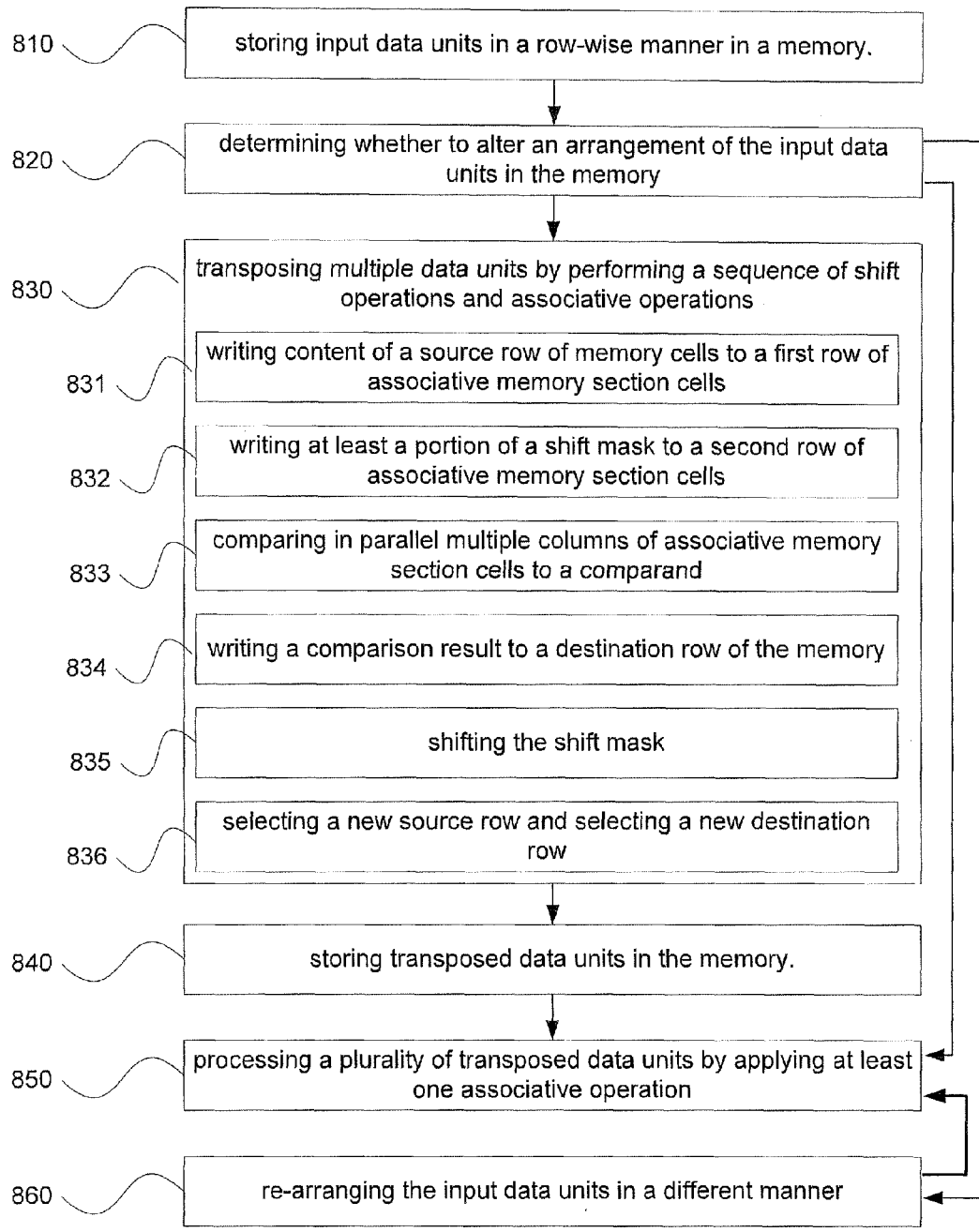
FIG. 8 illustrates a method for data processing, according to an embodiment of the invention.

FIG. 8 illustrates method 800 for data processing, according to an embodiment of the invention.

Method 800 can start by stage 810 of storing input data words in a row-wise manner in a memory. The memory includes multiple memory cells arranged in rows and columns.

Stage 810 can be followed by stage 820 of determining whether to alter an arrangement of the input data words in the memory. The alteration can include, for example, storing data words in a column-wise manner, partitioning frames and the like.

The determination can include determining to transpose input data words or not—in response to a desired computational mode—whether to perform calculations on column-wise vectors or on row-wise vectors. Column-wise vectors can utilize the parallelisms of a bit-wise logic but involves in an overhead resulting from a transposition of data words.

The determination can include re-arranging data words in order to reduce the time required for processing data words. For example—the image frame can be re-arranged such as to fit (or at least partially fit) a width of a row of associative memory cells (that perform associative operations).

If stage 820 determines to transpose input units than stage 810 can be followed by stage 830 of transposing multiple data words by performing a sequence of shift operations and associative operations. An associative operation includes comparing in parallel multiple columns of associative memory cells to at least one comparand. A non limiting example of a shift operation is disclosed in stage 126 of FIG. 6.

Stage 830 is followed by stage 840 of storing transposed data words in the memory.

Stage 840 can be followed by stage 850 of processing a plurality of transposed data words by applying at least one associative operation. The processing can involve performing various Boolean operations, adding vectors, multiplying vectors, implementing truth tables, applying logic functions and the like.

If stage 820 determines not to alter the arrangement of input data words than stage 820 can be followed by stage 850 (as illustrated in FIG. 8) or be followed by another stage such as stage 810.

Stage 820 can also include determining to re-arrange the input data words in a manner that differs from merely transposing data words. In this case stage 820 is followed by stage 860 of re-arranging the input data words in a different manner. Stage 860 can be followed by stage 850.

Stage 830 can include repeating the following stages: (i) stage 831 of writing content of a source row of memory cells to a first row of associative memory section cells; (ii) stage 832 of writing at least a portion of a shift mask to a second row of associative memory section cells; (iii) stage 833 of comparing in parallel multiple columns of associative memory cells to a comparand; wherein each column of the associative memory cells comprises one cell of the first row of associative memory cells and a corresponding cell of the first row of associative memory section cells; (iv) stage 834 of writing a comparison result to a destination row of the memory; (v) stage 835 of shifting the shift mask; and (vi) stage 836 of selecting a new source row and selecting a new destination row.

Figure 9:
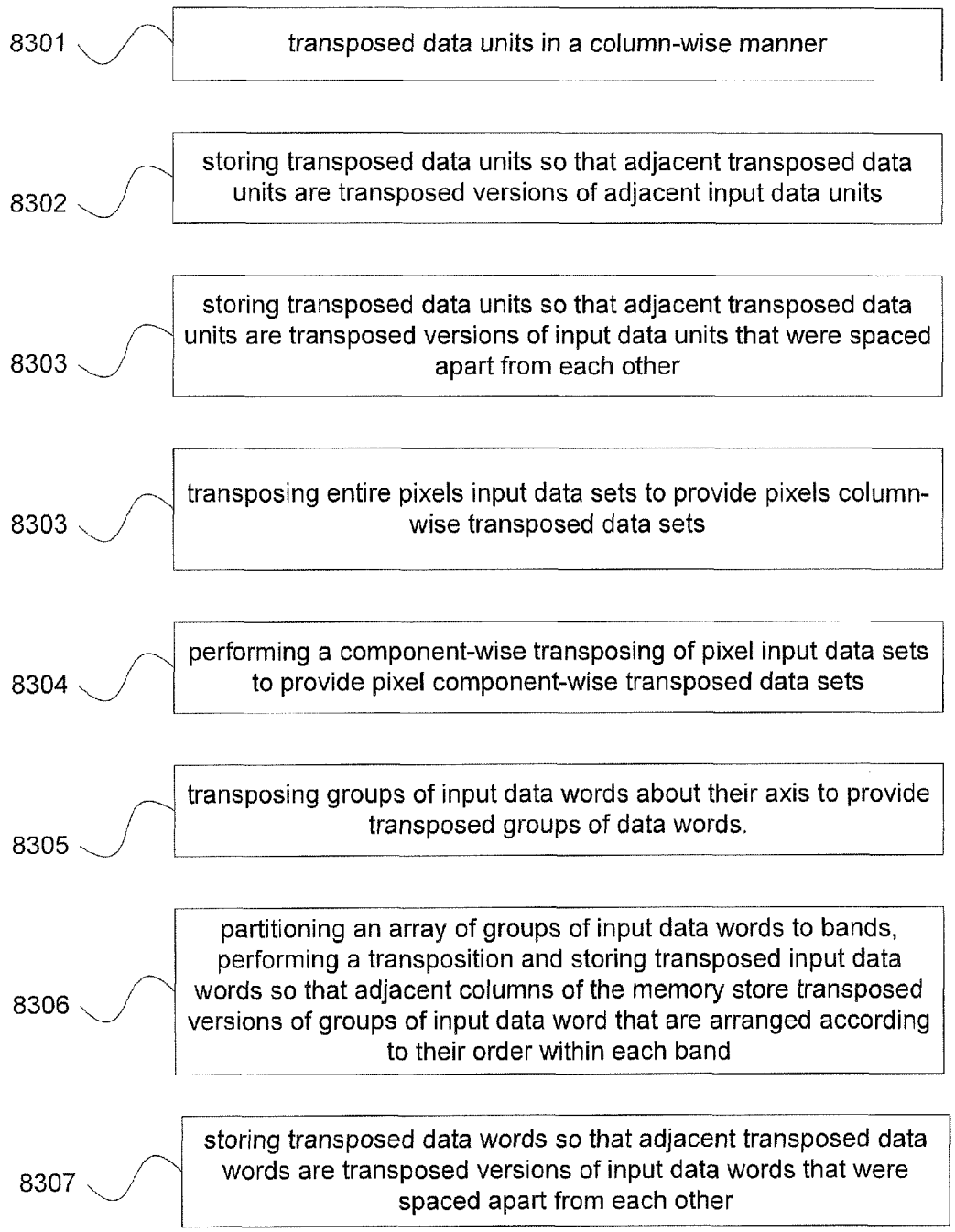
FIG. 9 illustrates various embodiments of a stage of the method of FIG. 8.

FIG. 9 illustrates various embodiments of stage 830.

FIG. 9 illustrates stage 830 as including at least one of the following stages 8301, 8302, 8303, 8304, 8304, 8306 and 8307.

Stage 8301 includes storing transposed data words in a column-wise manner. Accordingly—a sequence of bits of a data word that were stored in a row and now stored in a column.

Stage 8302 includes storing transposed data words so that adjacent transposed data words are transposed versions of adjacent input data words. For example—if a row of memory stored a sequence of data words that includes data words such as data words W1, W2, W3 and W4 then the transposed versions of W1-W4 are stored in a single column—one after the other.

Stage 8307 includes storing transposed data words so that adjacent transposed data words are transposed versions of input data words that were spaced apart from each other. This is illustrated, for example, in FIG. 5. FIG. 5 illustrates that transposed versions of adjacent input data words can be stored in a fixed distance (for example a distance of eight columns) from each other.

Data words can be arranged in data word sets. A data word set can include, for example, different color components of a single pixel. These color components can be red, green and blue color components of the same pixel but other representations of the pixel can also be included in a single data word set. An input data word set can be arranged in a row-manner—all color components are stored one after the other in the same row.

In this case stage 830 can include either one of stages 8303, 8304, 6305 or 8306.

Stage 8303 includes transposing entire pixels input data sets to provide pixels column-wise transposed data sets—each pixel input data set includes a row-wise sequence of different components of a single pixel.

Figure 10:
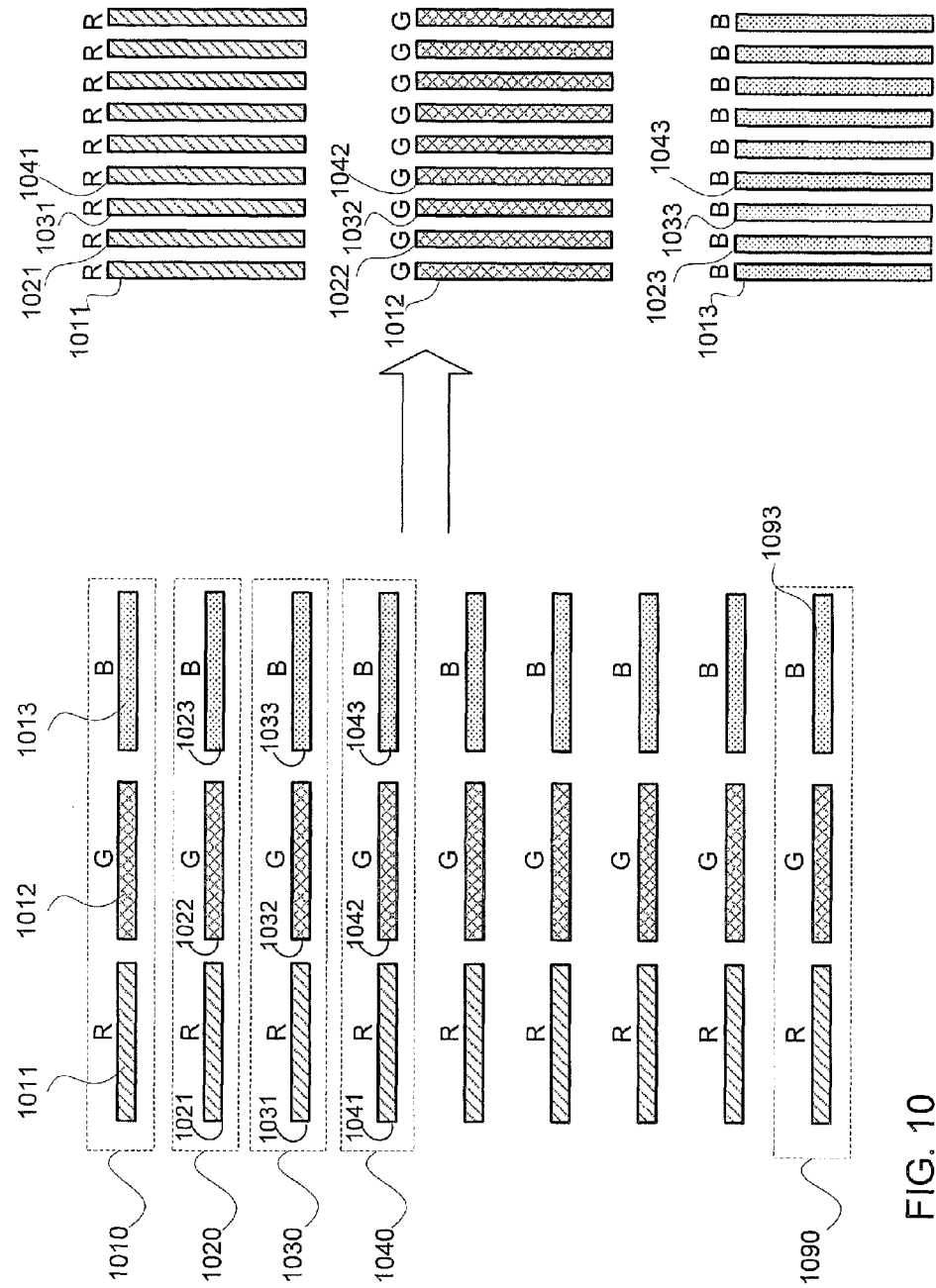

Referring to the example set forth in FIG. 10—pixel input data sets 1010, 1020, 1030 and 1040 are stored in four different rows of the memory. Each pixel input data set includes three color components (1011, 1012 and 1013), (1021, 1022 and 1023), and (1041, 1042 and 1043). After being transposed a first column of the memory stores color components 1011, 1012 and 1013, another column of the memory stores color components 1021, 1022 and 1023, a further column of the memory stores color components 1031, 1032 and 1033, and yet a further column of the memory stores color components 1041, 1042 and 1043.

Stage 8304 includes performing a component-wise transposing of pixel input data sets to provide pixel component-wise transposed data sets. Different color components of the same pixel are stored in different columns of the memory.

Figure 11:
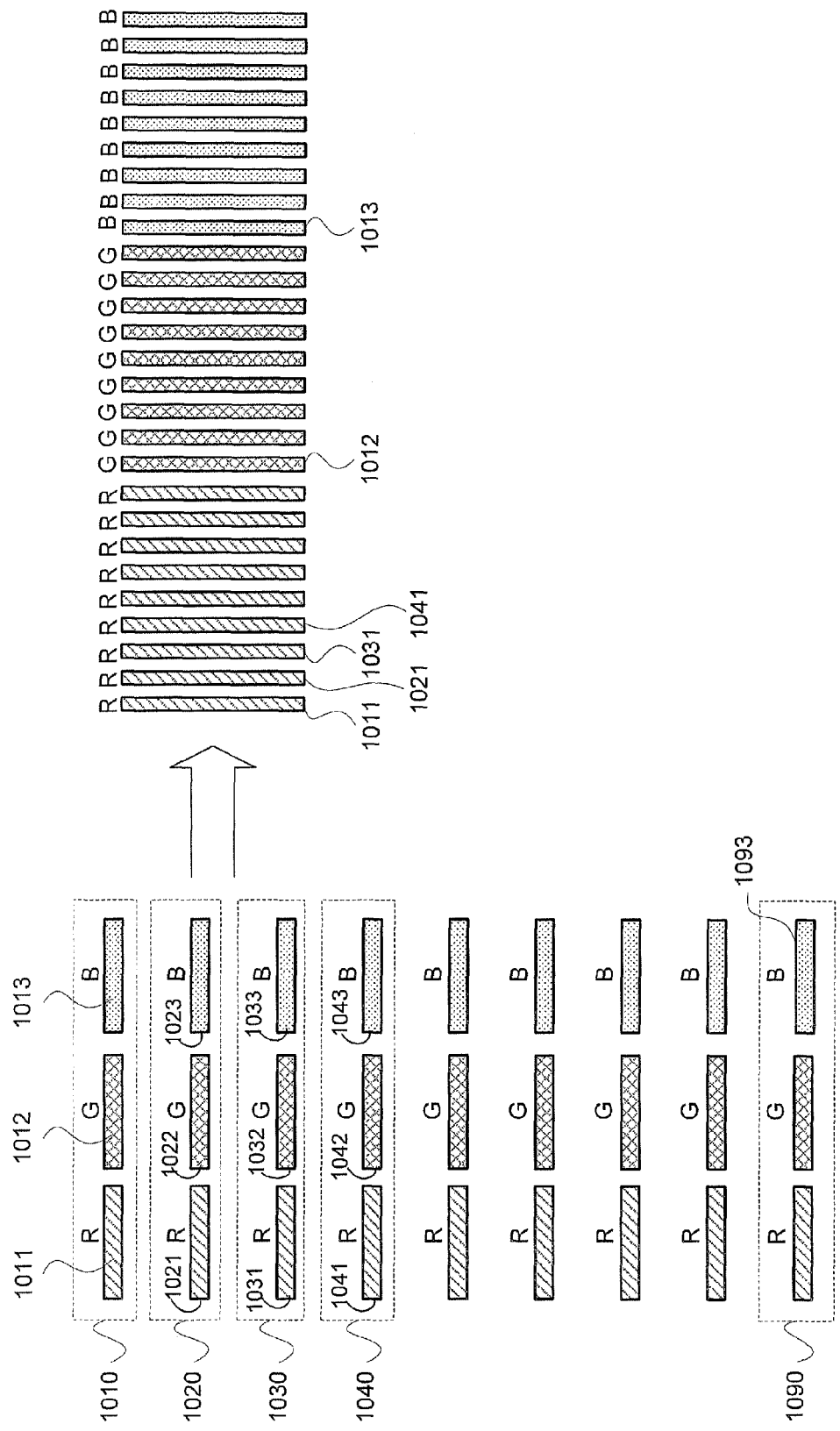

Referring to the example set forth in FIG. 11—pixel input data sets 1010, 1020, 1030 and 1040 are stored in different rows of the memory. Each pixel input data set includes three color components (1011, 1012 and 1013), (1021, 1022 and 1023), and (1041, 1042 and 1043). After being transposed different color components of each of these pixel input data sets are stored in different columns of the memory—and all color components are horizontally aligned. Thus—adjacent columns of the memory store color components 1011, 1012, 1013, 1021, 1022, 1023, 1041, 1042 and 1043.

Figure 12:
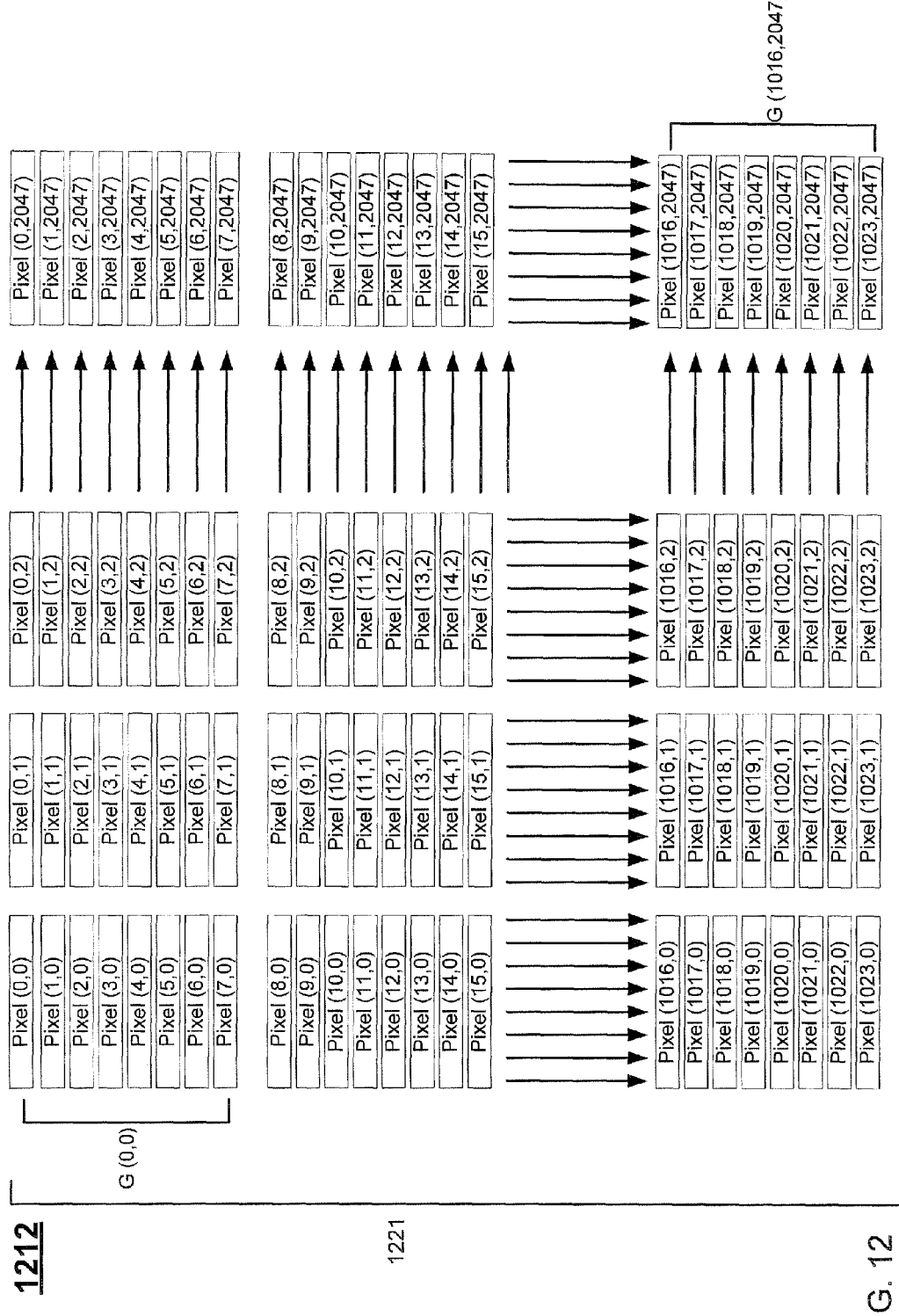
Figure 13:
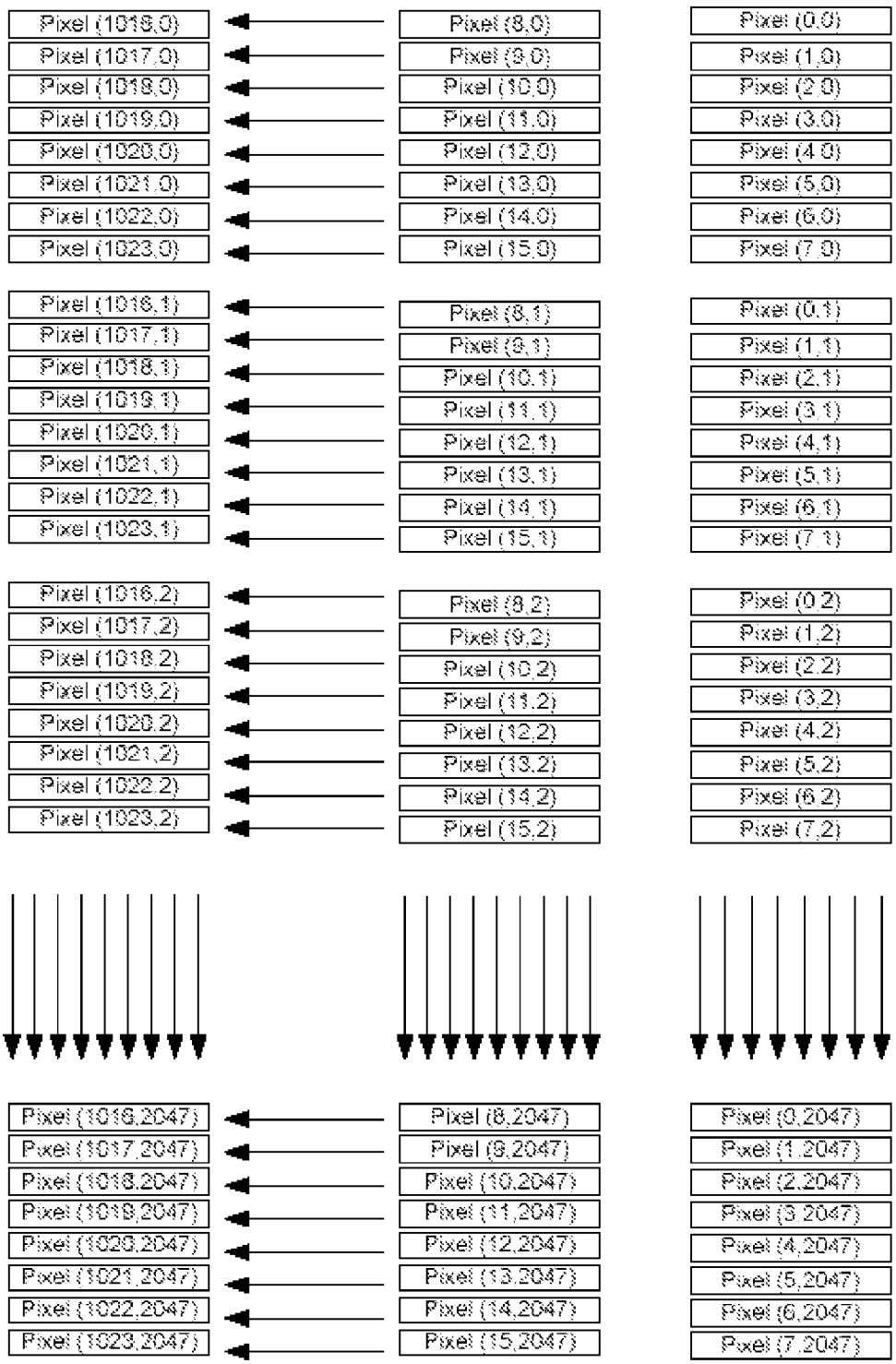

Stage 8305 includes transposing groups of input data words about their axis to provide transposed groups of data words. This is illustrated in FIGS. 12 and 13. FIG. 12 illustrates frame 1212 that includes an array of 2048×1024 pixels. Frame 1212 is partitioned to groups of input data words 1221. Pixels of the same group are stored in adjacent rows. FIG. 12 illustrates pixel groups G(0,0)-G(1016,2047). Each group includes eight pixels that are stored in eight different rows of the memory. Group G(0,0) includes pixels pixel (0,0) till pixel (7,0), group G(1016,2047) includes pixels pixel (1016,2047) till pixel (1023, 2047).

FIG. 13 illustrates transposed groups of input data words—each transposed group includes multiple pixels wherein pixels of the same group are stored in adjacent columns. The order of the groups remains unchanged but within group the pixels are stored in a column wise manner.

Figure 14:
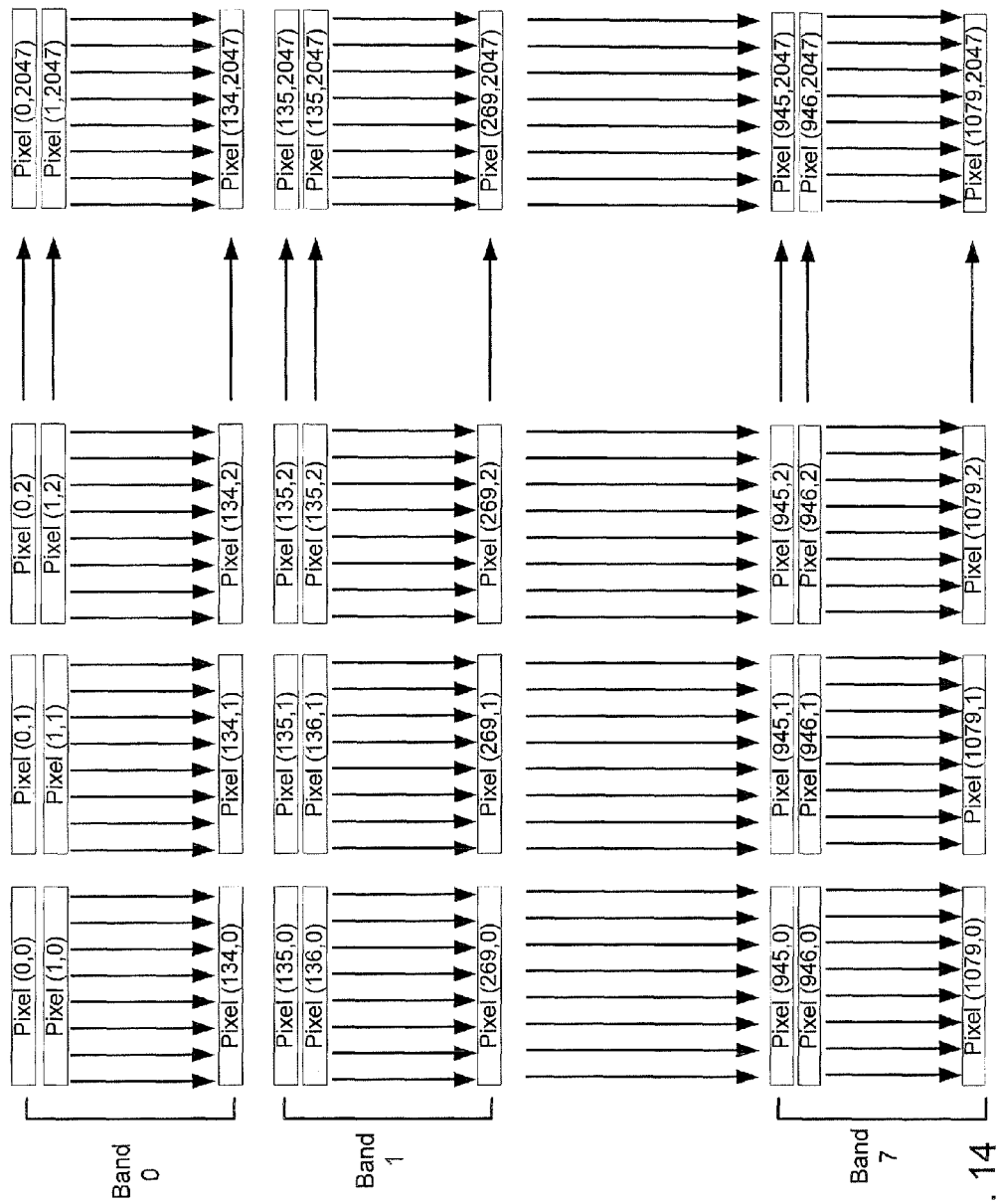
Figure 15:
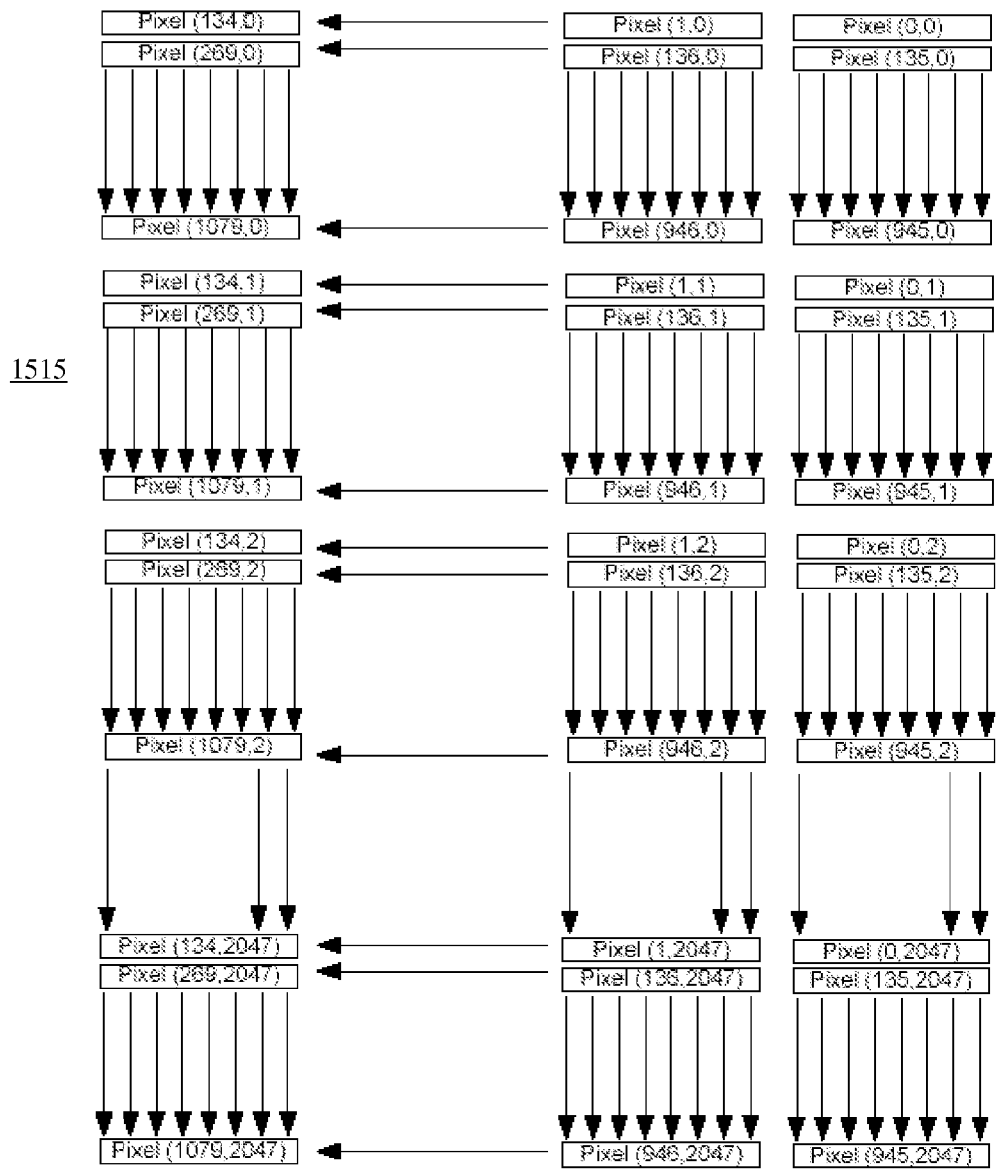

Stage 8306 includes partitioning an array of groups of input data words to bands, performing a transposition and storing transposed input data words so that adjacent columns of the memory store transposed versions of groups of input data word that are arranged according to their order within each band. This is illustrated in FIGS. 14 and 15. FIG. 14 illustrates frame 1414 that includes an array of 1920×1080 pixels. Frame 1414 is partitioned horizontally to bands, the number of bands is determined in advance. Each band includes 135 columns (lines) of the frame. Band_0 includes columns 0-134, band_1 includes columns 135-269 and so forth. FIG. 15 illustrates the frame after being transposed. The first eight columns of transposed frame 1515 are the first columns of each band—starting from the first column of the first band. They are followed by eight columns that are the second columns lines of each band, and so forth.

It is noted that either one of stages 8303, 8304, 8305 and 8306 can include duplicating multiple input data words and storing transposed versions of duplicated input data words. These duplications can be made so that data words that store pixel information of adjacent pixels are stored in proximity to each other. These duplications can be made in order place adjacent pixels near edges of other groups of pixels or edge of frames.

Stage 8307 can include transposing and duplicating code components of a pixel input data set while maintaining a row-wise arrangement of color components of the pixel input data set. The pixel input data set includes a row-wise sequence of different components of a single pixel and a code component that related to the single pixel. The outcome of stage 8307 can be a re-arranged pixel data set that is stored in an array of memory cells, each column of the array stores a bit of a color component and the entire code component.

Figure 16:
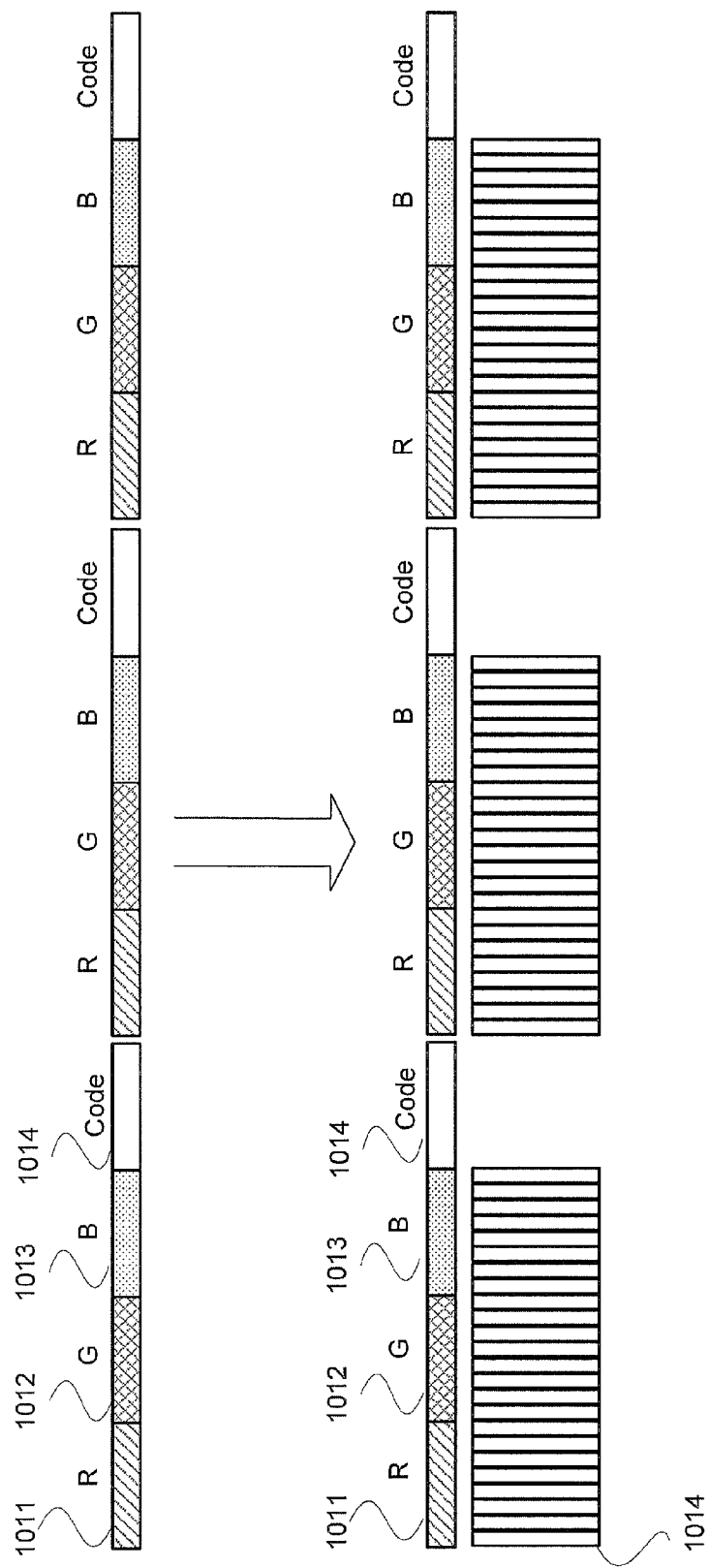

This is illustrated in FIG. 16. The upper part of FIG. 16 illustrates a pixel input data set include a red component word 1011, a green component word 1012, a blue component word 1013 and a code word 1014—all stored in a row-wise manner. The lower part of FIG. 16 illustrates the outcome of duplicating the code word, transposing it and placing it under the color component words—that are stored in a row-wise manner. Thus, each column of memory array that stores this set includes one bit of color component and a code word. The code word instructs a processor how to process the pixel—it can be an overlay (alpha) instruction. By transposing the code the system 40 can easily check conditions associated with the code (perform if/them operations)—as the code word can be easily sent to a column of associative memory cells and compared to a comparand.

According to an embodiment of the invention the data can be re-arranged in manners that differ from transposing data. The re-arrangement can assist in utilizing in a better manner the parallelism of the bitwise logic 60. It is noted that the re-arrangement can include a combination of transposing and yet another re-arrangement operation.

Figure 17:
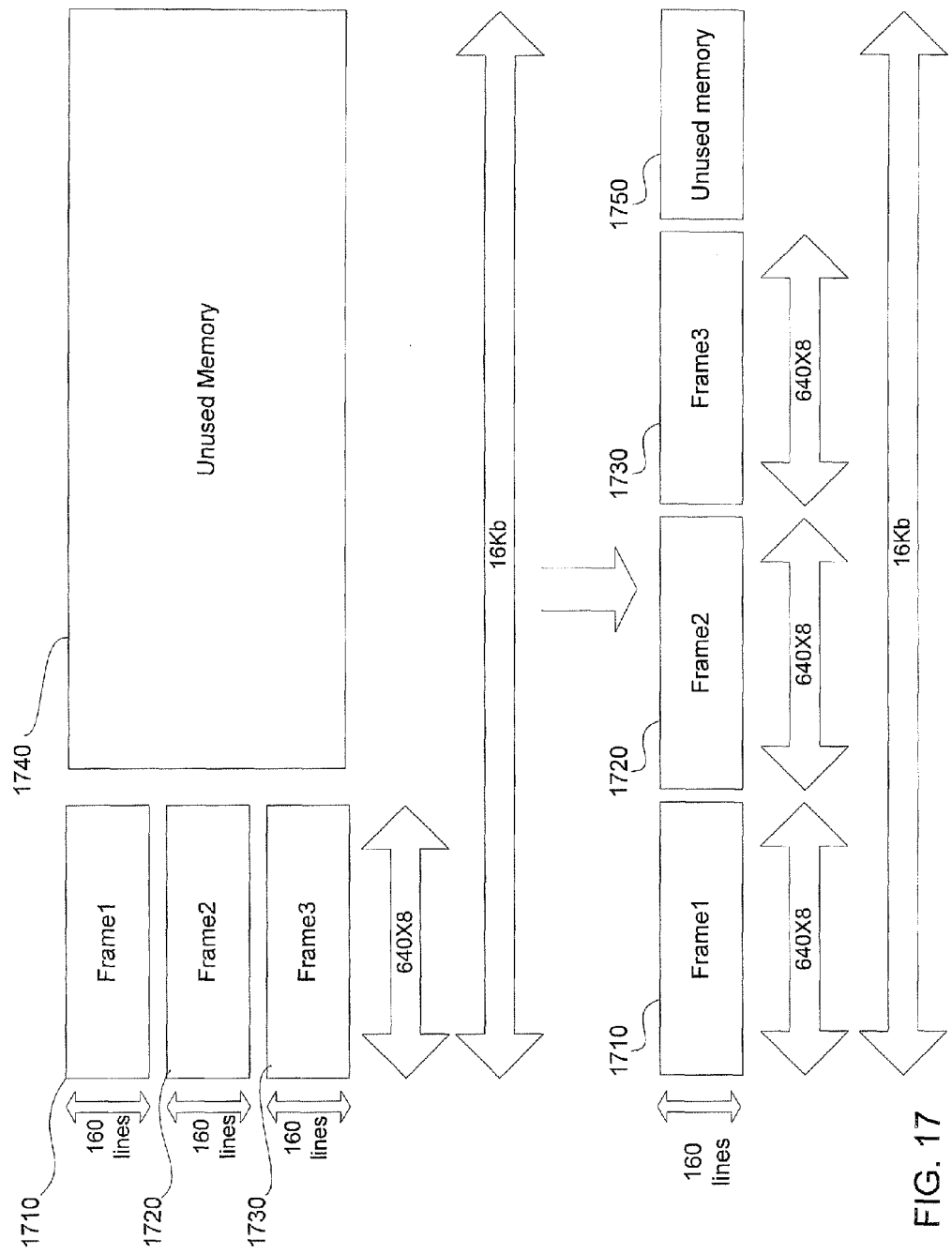

For example, small frames can be re-arranged so that multiple frame lines will be fed in parallel to bitwise logic. This is illustrated in FIG. 17 whereas a sequence of three portion of the same frame (denoted frame 1 1710, frame 2 1720 and frame 3 1730), each portion is of 640×840 pixels are stored in a vertically aligned manner in memory. By re-arranging these portions so that they are horizontally aligned—lines of these frame portions can be fed simultaneously to bit-wise logic. Unused memory is illustrated as 1740 in the upper part of FIG. 17 and as 1750 at the lower part of FIG. 17.

Figure 18:
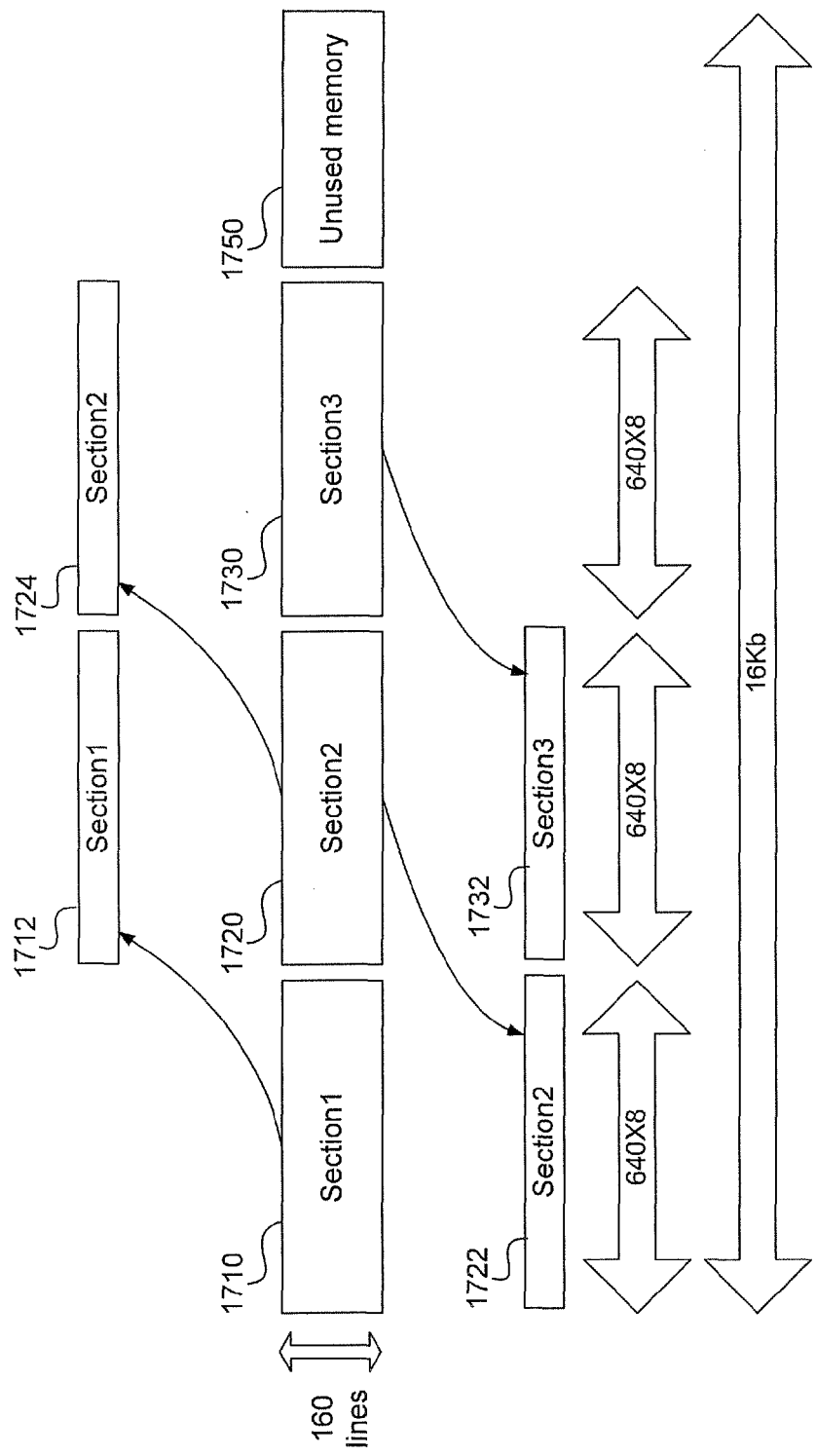

The re-arrangement can also include duplicating data word. This can be required if the re-arrangement move adjacent pixels apart from each other. For example, if the pixels of the last row of frame 1720 were the neighbors of pixels of the last row of frame 1710 than these rows should be duplicated and placed near the re-arranged first row pixels of frame 1720 and last row pixels of frame 1710. This is illustrated in FIG. 18. It is noted that the duplication can be applied, additionally or alternatively, to columns. It is also noted that the amount of duplicating pixels can depend upon the filter (or other process) that is being applied on the data words.

The re-arranged data word are the processed by applying associative operations.

Figure 19:
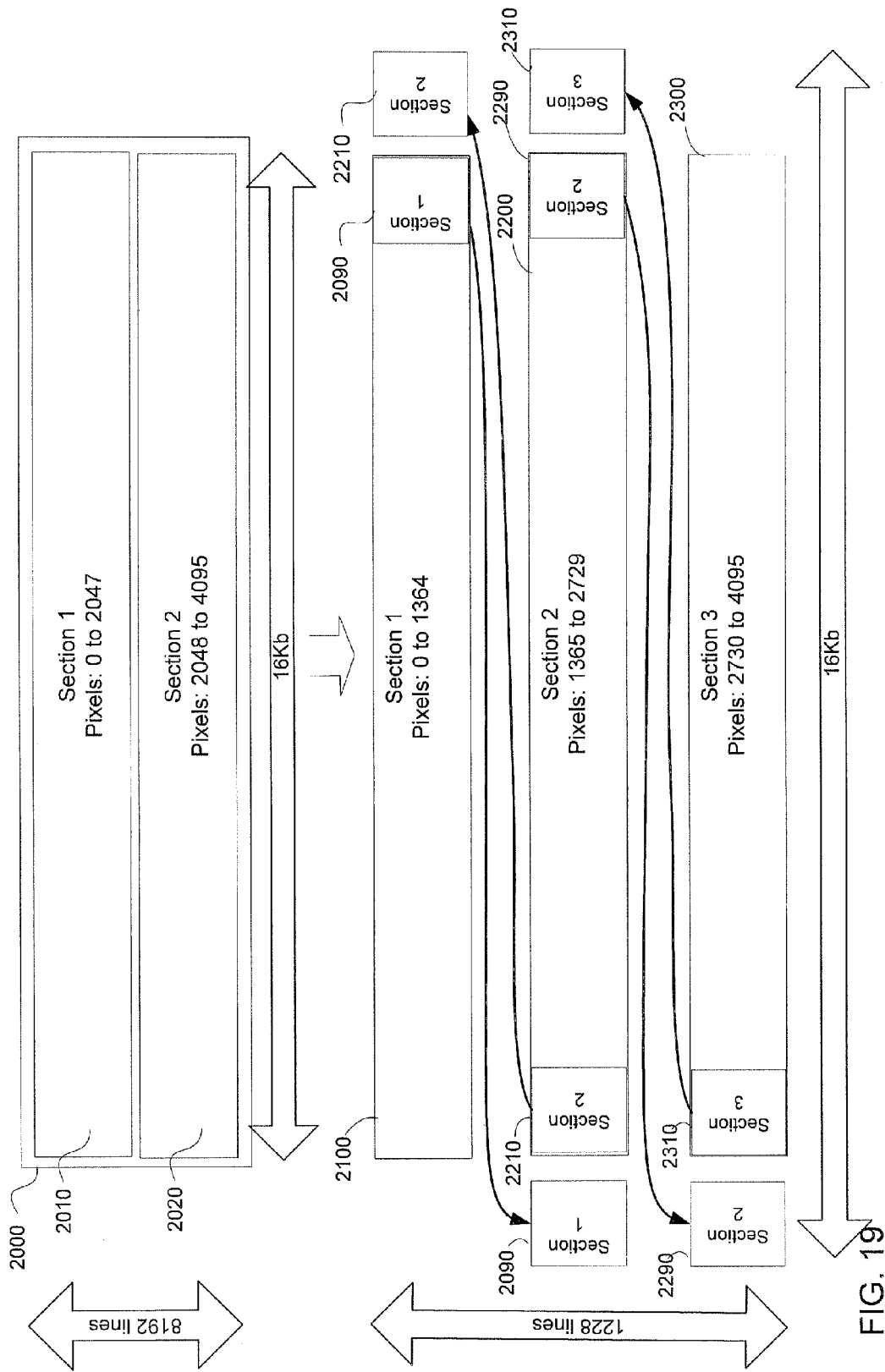

FIG. 19 illustrates another example of re-arrangement of data. Frame 2000 includes 4096×4096 pixels, each pixel is 8 bit long. Frame 2000 can be stored in an array of 8292 lines, each line includes 16 Kbits. In an 8 bit×16 Kbit memory the frame can be split to two sections 2010 and 2020—as illustrated in FIG. 19. If there is a need to duplicate pixels so that pixels of the edge of a section are stored near edge pixels of other sections of the frame than the frame can be split to three parts—and include overlapping pixels as illustrated in FIG. 20. FIG. 20 illustrates three sections 2100, 2200 and 2300 as well as duplicated pixels that are arranged in columns 2190, 2210, 2290, and 2310.

Duplicated pixels 2210 (duplicates of the rightmost columns of section 2200) are stored to the right of section 2100, duplicated pixels 2310 (duplicates of the rightmost columns of section 2300) are stored to the right of section 2200, duplicated pixels 2090 (duplicates of the rightmost columns of a section that is to the left of section 2100) are stored to the left of section 2200 and duplicated pixels 2290 (duplicates of the leftmost columns of section 2200) are stored to the left of section 2300.

Figure 21:
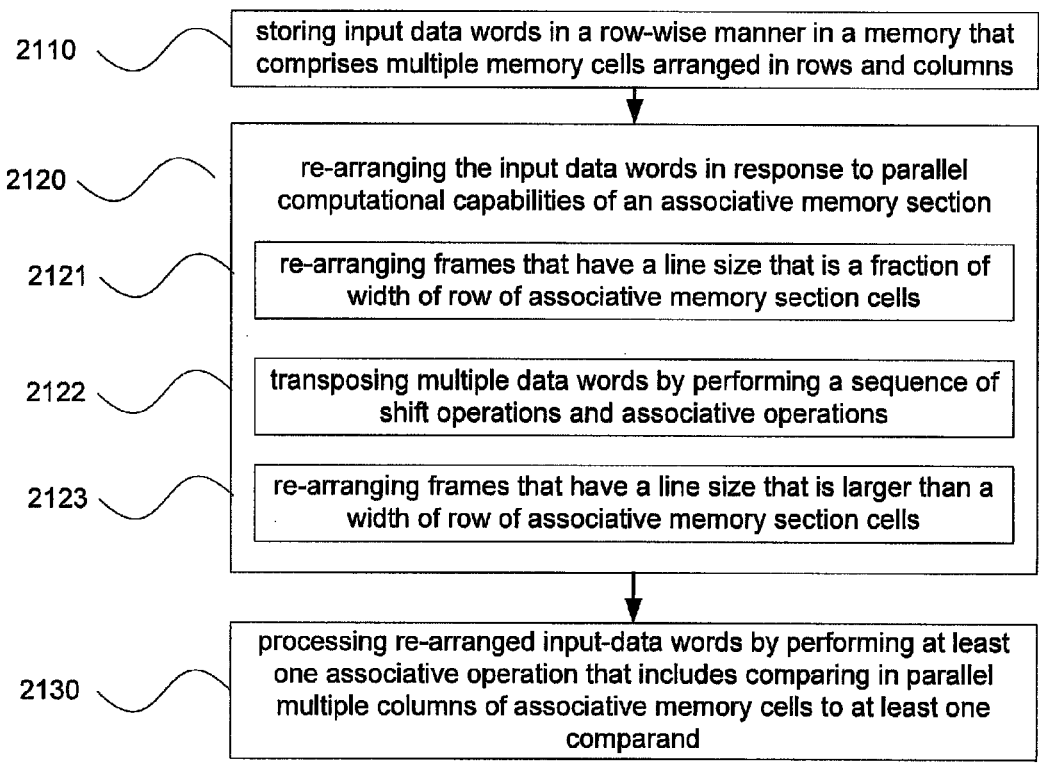
FIG. 21 illustrates a method for data processing, according to an embodiment of the invention.

FIG. 21 illustrates method 2100 for data processing, according to an embodiment of the invention.

Method 2100 starts by stage 2110 of storing input data words in a row-wise manner in a memory that includes multiple memory cells arranged in rows and columns.

Stage 2110 is followed by stage 2120 of re-arranging the input data words in response to parallel computational capabilities of an associative memory section.

Stage 2120 is followed by stage 2130 of processing re-arranged input-data words by performing at least one associative operation that includes comparing in parallel multiple columns of associative memory cells to at least one comparand.

Stage 2120 can include stage 2121 of re-arranging frames that have a line size that is a fraction of width of row of associative memory section cells; wherein the re-arranging comprises storing multiple frame lines in a single row of the memory.

Stage 2120 can include duplicating multiple input data words so that data words that store pixel information of adjacent pixels are stored in proximity to each other.

Stage 2120 can include stage 2122 of transposing multiple data words by performing a sequence of shift operations and associative operations.

Stage 2120 can include stage 2123 of re-arranging frames that have a line size that is larger than a width of row of associative memory section cells; wherein the re-arranging comprises storing vertically partitioning a frame to multiple frame portions, wherein a width of each frame portion does not exceed the width of row of associative memory section cells.

Stage 2123 can include duplicating multiple input data words so that data words that store pixel information of adjacent pixels are stored in proximity to each other.

Figure 22:
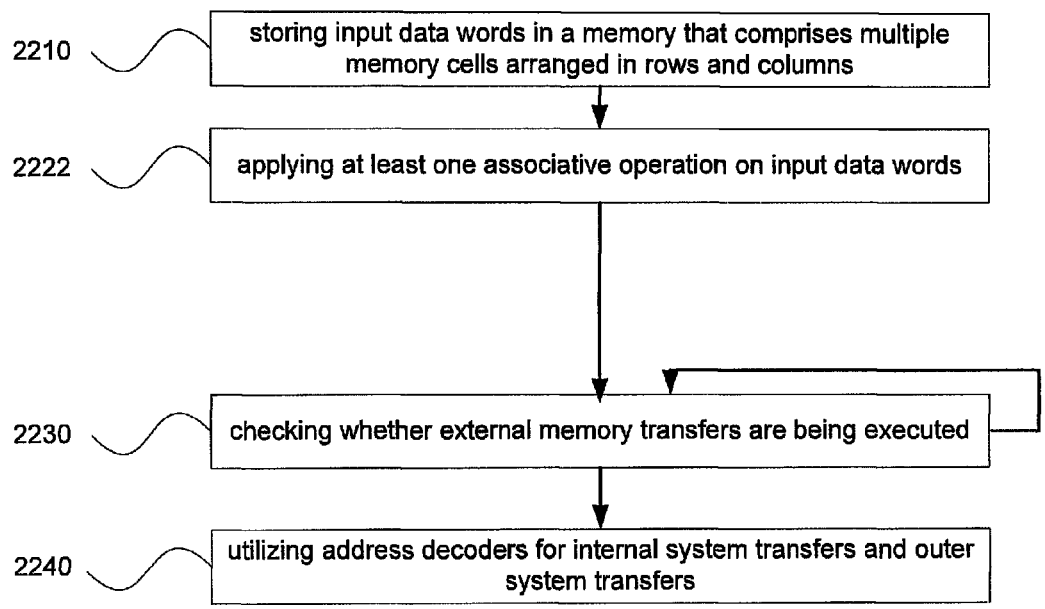
FIG. 22 illustrates a method for data processing, according to an embodiment of the invention.

FIG. 22 illustrates method 2200 for data processing according to an embodiment of the invention.

Method 2200 starts by stage 2210 of storing input data words in a memory that comprises multiple memory cells arranged in rows and columns.

Stage 2210 is followed by stage 2222 of applying at least one associative operation on input data words. The applying includes comparing in parallel multiple columns of associative memory cells to at least one comparand.

Stage 2222 is followed by stage 2230 of checking whether external memory transfers are being executed. If so—initial memory transfers that use memory decoders are prevented. This is illustrated by an arrow that is directed from stage 2230 to itself. Else—stage 2230 is followed by stage 2240 of utilizing address decoders for internal system transfers and outer system transfers. The system includes the address decoders, and registers rows that are coupled between the columns of the associative memory cells and the multiple memory cells. Internal system transfers involve storing data words in registers coupled to the address decoders.

When adding horizontally stored vectors to each other the carry can be managed in various manners. For example—the calculation can include performing carry save adder scheme, generating carry prediction vectors and the like.

Figure 23:
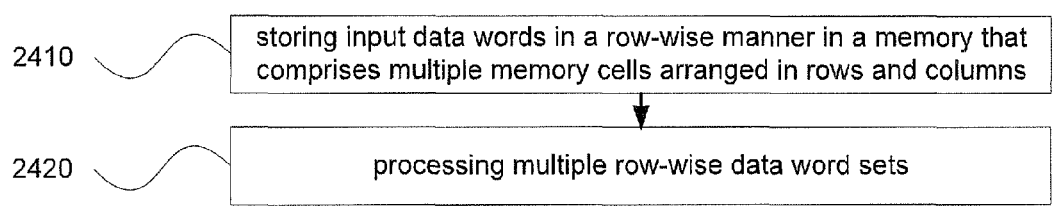
FIG. 23 illustrates a method for data processing, according to an embodiment of the invention.

FIG. 23 illustrates method 2400 for data processing, according to an embodiment of the invention.

Method 2400 starts by stage 2410 of storing input data words in a row-wise manner in a memory that comprises multiple memory cells arranged in rows and columns.

Stage 2410 is followed by stage 2420 of processing multiple row-wise data word sets. Stage 2420 includes generating at least one carry prediction vector by performing multiple shift operations and associative operations. An associative operation comprises comparing in parallel multiple columns of associative memory cells to at least one comparand.

The carry prediction vector is calculated before adding two data word sets (two vectors—denoted A and B) to each other. Preparing such a vectors can be faster than performing carry ripple after the addition of the vectors. After it is prepared the carry prediction vector is added to another vector that is a XOR of the vectors A and B. There is no need to ripple the carry after the addition since it has been pre-rippled.

Stage 2420 can be represented by the following pseudo-code, wherein A and B are two X-bit vectors that are added to each other, A and B also refer to memory cell rows that store these vectors, Tag is the content of the Tag Array, XOR, AND and OR are logical operations XOR, AND and OR, ShiftLeft represent a shift to the left operation.

A=XOR B
Tag=A and B
Tag=ShiftLeft(Tag)
B=Tag
Repeat X times {preparing the carry vector}
a. Tag=A AND Tag
b. Tag=ShiftLeft(Tag) OR Tag
B=B OR Tag
A=B+A {using a half adder—no carry ripple}

Either one of systems 40 and 41 can apply either one of the mentioned above or a combination thereof.

The various methods mentioned above can be executed by hardware components such as the systems illustrated above. For a non-limiting example, various stages such as stages 2420, 2222, 2230, 2240, 2120, 8303, 8304, 8305, 8306, 8307 can be executed by at least one hardware component out of an associative memory cells and control logic.

It will be appreciated that the embodiments described above are cited by way of example, and that the present invention is not limited to what has been particularly shown and described hereinabove. Rather, the scope of the present invention includes both combinations and subcombination of the various features described hereinabove, as well as variations and modifications thereof which would occur to persons skilled in the art upon reading the foregoing description and which are not disclosed in the prior art.

The invention claimed is:

1. A method for data processing, the method comprising:
   storing input data words in a row-wise manner in a memory that comprises multiple memory cells arranged in rows and columns; and
   transposing multiple data words by performing a sequence of shift operations and associative operations; wherein an associative operation comprises comparing in parallel multiple columns of associative memory cells to at least one comparand; and storing transposed data words in the memory,
   wherein the transposing comprises repeating the stages of:
      writing content of a source row of memory cells to a first row of associative memory section cells;
      writing at least a portion of a shift mask to a second row of associative memory section cells;
      comparing in parallel multiple columns of associative memory cells to a comparand, wherein each column of the associative memory cells comprises one cell of the first row of associative memory cells and a corresponding cell of the second row of associative memory section cells;
      writing a comparison result to a destination row of the memory;
      shifting the shift mask; and
      selecting a new source row and selecting a new destination row.

2. A method for data processing, the method comprising:
   storing input data words in a row-wise manner in a memory that comprises multiple memory cells arranged in rows and columns;
   transposing multiple data words by performing a sequence of shift operations and associative operations; wherein an associative operation comprises comparing in parallel multiple columns of associative memory cells to at least one comparand; and storing transposed data words in the memory;
   transposing groups of input data words to provide column-wise transposed groups of data words; wherein a group of input data words comprises multiple vertically aligned input data words; and
   duplicating multiple input data words and storing transposed versions of duplicated input data words.

3. A method for data processing, the method comprising:
   storing input data words in a row-wise manner in a memory that comprises multiple memory cells arranged in rows and columns;
   transposing multiple data words by performing a sequence of shift operations and associative operations; wherein an associative operation comprises comparing in parallel multiple columns of associative memory cells to at least one comparand; and storing transposed data words in the memory;
   transposing groups of input data words to provide column-wise transposed groups of data words; wherein a group of input data words comprises multiple vertically aligned input data words; and
   duplicating multiple input data words so that transposed data words that store pixel information of adjacent pixels are stored in proximity to each other.

4. A method for data processing, the method comprising:
   storing input data words in a row-wise manner in a memory that comprises multiple memory cells arranged in rows and columns;
   transposing multiple data words by performing a sequence of shift operations and associative operations; wherein an associative operation comprises comparing in parallel multiple columns of associative memory cells to at least one comparand; and storing transposed data words in the memory; and
   transposing and duplicating code components of a pixel input data set while maintaining a row-wise arrangements of color components of the pixel input data set; wherein the pixel input data set comprises a row-wise sequence of different components of a single pixel and a code component that related to the single pixel.

5. A method for data processing, comprising:
   storing input data words in a row-wise manner in a memory that comprises multiple memory cells arranged in rows and columns;
   re-arranging the input data words in response to parallel computational capabilities of an associative memory section;
   processing re-arranged input-data words by performing at least one associative operation that comprises comparing in parallel multiple columns of associative memory cells to at least one comparand; and
   duplicating multiple input data words so that data words that store pixel information of adjacent pixels are stored in proximity to each other.

6. A method for data processing, comprising:
   storing input data words in a row-wise manner in a memory that comprises multiple memory cells arranged in rows and columns;
   re-arranging the input data words in response to parallel computational capabilities of an associative memory section;
   processing re-arranged input-data words by performing at least one associative operation that comprises comparing in parallel multiple columns of associative memory cells to at least one comparand;
   re-arranging frames that have a line size that is larger than a width of row of associative memory section cells; wherein the re-arranging comprises storing vertically partitioning a frame to multiple frame portions, wherein a width of each frame portion does not exceed the width of row of associative memory section cells; and duplicating multiple input data words so that data words that store pixel information of adjacent pixels are stored in proximity to each other.

7. A system having data processing capabilities, the system comprises:

a semiconductor substrate;

a memory that is formed on the semiconductor substrate and comprises multiple memory cells arranged in rows and columns;

associative memory cells that are arranged in rows and columns; and a control logic that is coupled to the memory and to the associative memory cells;

wherein the memory stores input data words in a row-wise manner;

wherein the control logic controls a transposition of multiple data words by performing a sequence of shift operations and associative operations that provide transposed data words;

wherein an associative operation comprises comparing in parallel multiple columns of associative memory cells to at least one comparand;

wherein the memory stores the transposed data words; and wherein the control logic is adapted to control a transposition of multiple data words by a repetition of:

write a content of a source row of memory cells to a first row of associative memory section cells;

write at least a portion of a shift mask to a second row of associative memory section cells;

compare in parallel multiple columns of associative memory cells to a comparand;

wherein each column of the associative memory cells comprises one cell of the first row of associative memory cells and a corresponding cell of the second row of associative memory section cells;

write a comparison result to a destination row of the memory; shifting the shift mask; and select a new source row and selecting a new destination row.

8. A system having data processing capabilities, the system comprises:

a semiconductor substrate;

a memory that is formed on the semiconductor substrate and comprises multiple memory cells arranged in rows and columns;

associative memory cells that are arranged in rows and columns; and a control logic that is coupled to the memory and to the associative memory cells;

wherein the memory stores input data words in a row-wise manner;

wherein the control logic controls a transposition of multiple data words by performing a sequence of shift operations and associative operations that provide transposed data words;

wherein an associative operation comprises comparing in parallel multiple columns of associative memory cells to at least one comparand;

wherein the memory stores the transposed data words;

wherein the control logic is adapted to control a transposing of groups of input data words to provide column-wise transposed groups of data words; wherein a group of input data words comprises multiple vertically aligned input data words; and wherein the control logic is adapted to control a duplication of multiple input data words and store transposed versions of duplicated input data words.

9. A system having data processing capabilities, the system comprises:

a semiconductor substrate;

a memory that is formed on the semiconductor substrate and comprises multiple memory cells arranged in rows and columns;

associative memory cells that are arranged in rows and columns; and a control logic that is coupled to the memory and to the associative memory cells;

wherein the memory stores input data words in a row-wise manner;

wherein the control logic controls a transposition of multiple data words by performing a sequence of shift operations and associative operations that provide transposed data words;

wherein an associative operation comprises comparing in parallel multiple columns of associative memory cells to at least one comparand;

wherein the memory stores the transposed data words;

wherein the control logic is adapted to control a transposing of groups of input data words to provide column-wise transposed groups of data words; wherein a group of input data words comprises multiple vertically aligned input data words; and wherein the control logic is adapted to control a duplication of multiple input data words so that transposed data words that store pixel information of adjacent pixels are stored in proximity to each other.

10. A system having data processing capabilities, the system comprises:

a semiconductor substrate;

a memory that is formed on the semiconductor substrate and comprises multiple memory cells arranged in rows and columns;

associative memory cells that are arranged in rows and columns; and a control logic that is coupled to the memory and to the associative memory cells;

wherein the memory stores input data words in a row-wise manner;

wherein the control logic controls a transposition of multiple data words by performing a sequence of shift operations and associative operations that provide transposed data words;

wherein an associative operation comprises comparing in parallel multiple columns of associative memory cells to at least one comparand;

wherein the memory stores the transposed data words;

wherein the control logic is adapted to control a transposing of groups of input data words to provide column-wise transposed groups of data words; wherein a group of input data words comprises multiple vertically aligned input data words; and wherein the control logic is adapted to control a transposing and a duplicating of code components of a pixel input data set while maintaining a row-wise arrangements of color components of the pixel input data set; wherein the pixel input data set comprises a row-wise sequence of different components of a single pixel and a code component that related to the single pixel.

11. A system having data processing capabilities, the system comprises:

a semiconductor substrate;

a memory that is formed on the semiconductor substrate and comprises multiple memory cells arranged in rows and columns;

associative memory cells that are arranged in rows and columns; and control logic that is coupled to the memory and to the associative memory cells;

wherein the control logic controls a re-arrangement of the input data words in response to parallel computational capabilities of an associative memory section, and controls a process of re-arranged input-data words by instructing the associative memory cells to perform at least one associative operation that comprises comparing in parallel multiple columns of associative memory cells to at least one comparand; and wherein the control logic is adapted to control a duplication of multiple input data words so that data words that store pixel information of adjacent pixels are stored in proximity to each other.

12. A system having data processing capabilities, the system comprises:

a semiconductor substrate;

a memory that is formed on the semiconductor substrate and comprises multiple memory cells arranged in rows and columns;

associative memory cells that are arranged in rows and columns; and control logic that is coupled to the memory and to the associative memory cells;

wherein the control logic controls a re-arrangement of the input data words in response to parallel computational capabilities of an associative memory section, and controls a process of re-arranged input-data words by instructing the associative memory cells to perform at least one associative operation that comprises comparing in parallel multiple columns of associative memory cells to at least one comparand; and wherein the control logic is adapted to control a re-arrangement of frames that have a line size that is larger than a width of row of associative memory section cells; wherein the re-arrangement comprises storing vertically partitioning a frame to multiple frame portions, wherein a width of each frame portion does not exceed the width of row of associative memory section cells; and wherein the control logic is adapted to control a duplication of multiple input data words so that data words that store pixel information of adjacent pixels are stored in proximity to each other.

* * * * *